United States Patent [19]
Kano et al.

[11] Patent Number: 5,447,781
[45] Date of Patent: Sep. 5, 1995

[54] MAGNETORESISTANCE FILM AND METHOD OF MANUFACTURING SAME

[75] Inventors: Hiroshi Kano; Kazuhiko Hayashi, both of Kanagawa, Japan

[73] Assignee: Sony Corporation, Tokyo, Japan

[21] Appl. No.: 95,432

[22] Filed: Jul. 23, 1993

[30] Foreign Application Priority Data

| Jul. 31, 1992 | [JP] | Japan | 4-224589 |
| Dec. 4, 1992 | [JP] | Japan | 4-350572 |
| Mar. 2, 1993 | [JP] | Japan | 5-041505 |

[51] Int. Cl.$^6$ ............................................. G11B 5/127
[52] U.S. Cl. ........................................... 428/212; 428/213; 428/611; 428/635; 428/694 TM; 428/692; 428/900; 428/928; 360/113
[58] Field of Search ............... 428/694 TM, 900, 611, 428/635, 928, 212, 692, 213; 324/252; 360/113

[56] References Cited

U.S. PATENT DOCUMENTS

| 4,920,013 | 4/1990 | Kobayashi et al. | 428/694 |
| 4,949,039 | 8/1990 | Grunberg | 324/252 |
| 5,151,137 | 9/1992 | Yoshizawa et al. | 148/313 |
| 5,157,570 | 10/1992 | Shukovsky et al. | 360/126 |
| 5,159,513 | 10/1992 | Dieny et al. | 360/113 |
| 5,206,590 | 4/1993 | Dieny et al. | 324/252 |
| 5,243,316 | 9/1993 | Sakakima et al. | 338/32 R |
| 5,277,991 | 1/1994 | Satomi et al. | 428/611 |
| 5,341,118 | 8/1994 | Parkin et al. | 338/32 R |

FOREIGN PATENT DOCUMENTS

| 0406060 | 1/1991 | European Pat. Off. |
| 0442407 | 8/1991 | European Pat. Off. |
| 0498640 | 8/1992 | European Pat. Off. |
| 0526044 | 2/1993 | European Pat. Off. |
| 2677811 | 12/1992 | France |

OTHER PUBLICATIONS

13th International Coll. on Magnetic Films and Surfaces; 26–30 Aug. 1991 Glasgow United Kingdom: "Giant Magnetoresistance and Oscillatory Interlayer Exchange Coupling in Cu Based Multilayers Grown by Sputtering and MBE"; pp. 231–232.
Patent Abstract of Japan, vol. 14, No. 168 (E-912) 30 Mar. 1990 & JP-A-02 023 681, Titled: Magnetoresistance Effect Element.

*Primary Examiner*—Stevan A. Resan
*Attorney, Agent, or Firm*—Hill, Steadman & Simpson

[57] ABSTRACT

A magnetoresistance film has an artificial lattice film structure having alternating conductive and magnetic layers. The anisotropic magnetic field $H_k$ of the magnetic layers and the anti-ferromagnetic coupling magnetic field $H_s$ between the magnetic layers which face each other through the conductive layers satisfy the relationship $H_k < H_s$. The conductive layers contain 0.05 to 5 atomic % of at least one material selected from the group consisting of iron, cobalt, and nickel. The thickness d of each conductive layer is selected in the range of $1.02 \times d_{max} \leq d \leq 1.10 \times d_{max}$ or $0.90 \times d_{max} \leq d \leq 0.98 \times d_{max}$. The magnetoresistance is exhibited substantially isotropically in the plane of the layers. The magnetoresistance film has large magnetoresistance prevented from being reduced due to the anisotropy of the magnetic layers, a high sensitivity, and keeps its large magnetoresistance stably. A method of manufacturing such a magnetoresistance film is also disclosed.

3 Claims, 19 Drawing Sheets

F I G. 9
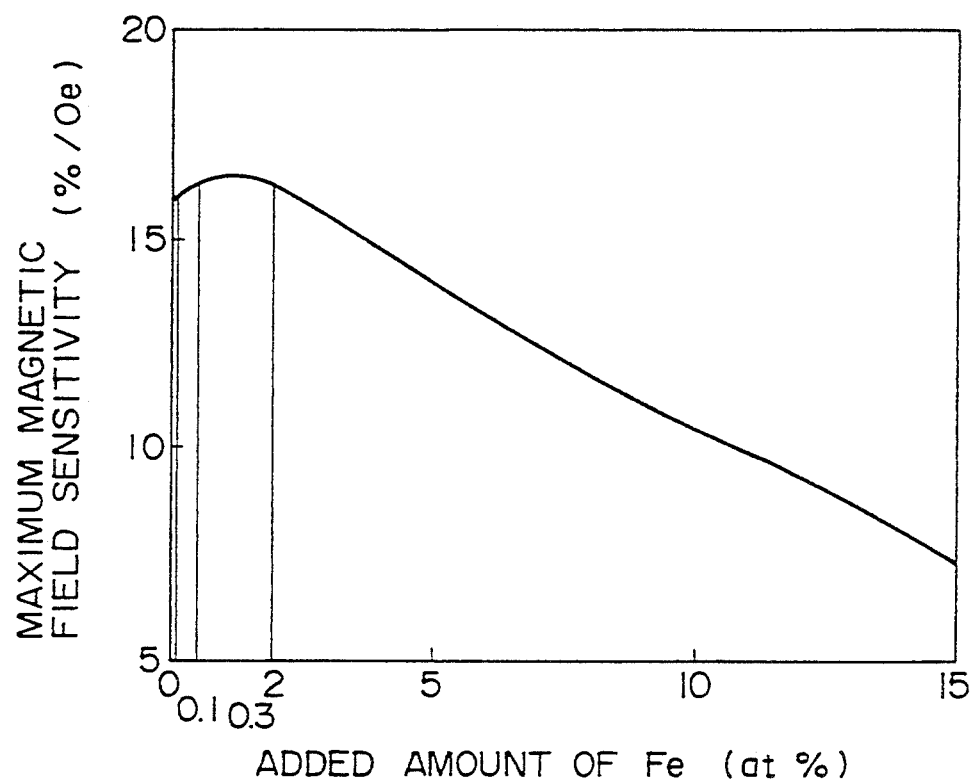
F I G. 10
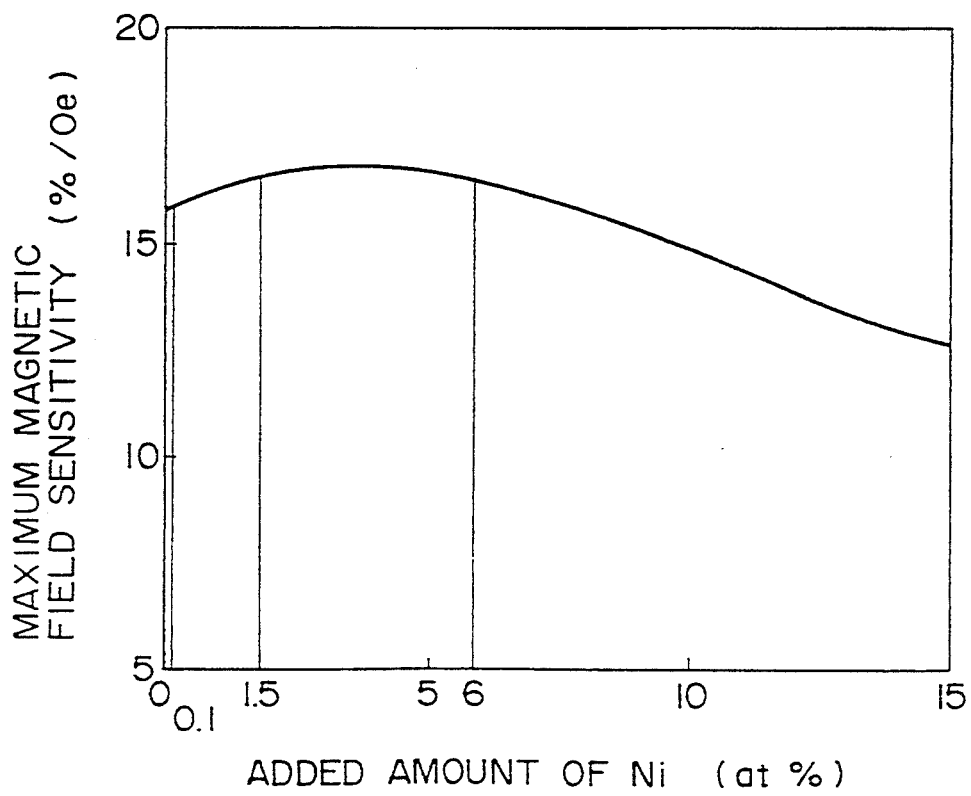

F I G. 16
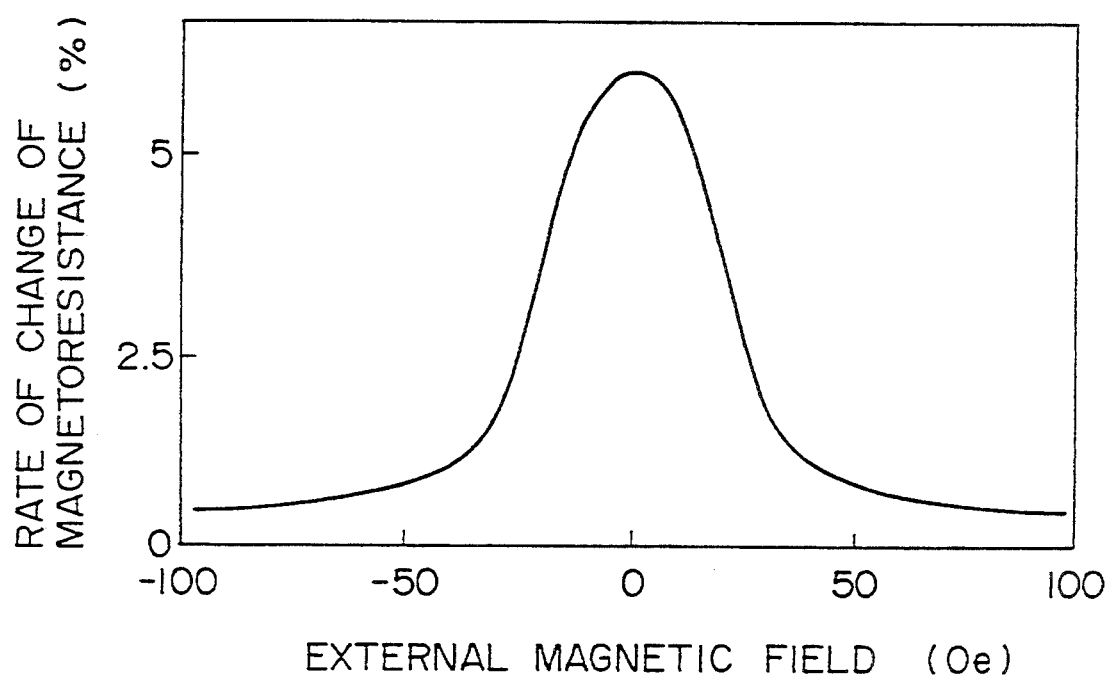

F I G. 20
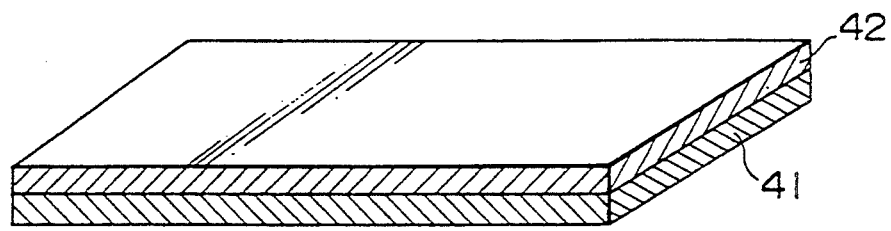
F I G. 21
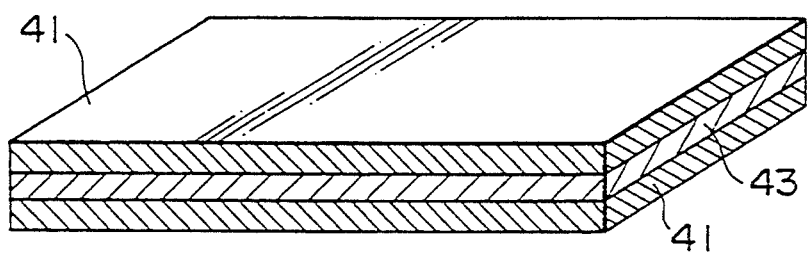
F I G. 22
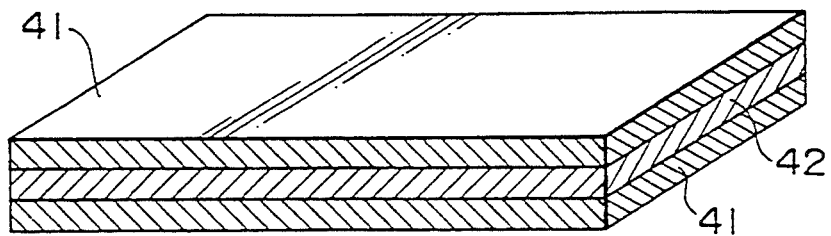

MAGNETORESISTANCE FILM AND METHOD OF MANUFACTURING SAME

BACKGROUND OF THE INVENTION

1. Field of the Invention

The present invention relates to a magnetoresistance film and a method of manufacturing such a magnetoresistance film, and more particularly to a magnetoresistance device and a magnetoresistance magnetic head which incorporate such a magnetoresistance film. More specifically, the present invention is concerned with a highly sensitive magnetoresistance film having an artificial superlattice film structure exhibiting a large magnetic reluctance and suitable for use in magnetoresistance device such as a magnetic sensor or the like or a magnetoresistance magnetic head such as a playback head for a magnetic disc drive, and a method of manufacturing such a highly-sensitive magnetoresistance film.

2. Description of the Relevant Art

Magnetoresistance films are widely used as a magnetoresistance device for detecting a magnetic field in the fields of magnetic sensors, magnetic heads, rotation detectors, position detectors, etc.

For example, Permalloy, which is a typical material for magnetoresistance films, is used in the magnetic sensor of a magnetoresistance head (MR head) for reading a weak signal magnetic field in the art of magnetic recording because its anisotropic magnetic field has a small level of about 4 gausses and it has very good soft magnetic characteristics.

However, the rate of change of the magnetoresistance of Permalloy is of about several percent at maximum, and hence Permalloy does not provide sufficient sensitivity for high-density magnetic recording trends that appear to develop further in the future.

The magnetoresistance of Permalloy is greatly governed by the direction of a bias magnetic field applied thereto. If Permalloy is used in the magnetic sensor of an MR head, then it is necessary to control the direction of the anisotropy of the material.

Much attention has been directed in recent years to artificial superlattices which are composed of alternating layers of different metals each several atoms thick. There has been reported artificial superlattice composed of a laminated structure of magnetic layers (Fe layers) and conductive layers (Cr layers) and exhibiting a large magnetoresistance of about several tens percent (see Physical Review Letters, Vol. 61, page 2472, 1988). The reported artificial superlattice is expected to find an application in magnetoresistance devices.

A subsequent effort has resulted in an artificial superlattice composed of a laminated structure of magnetic layers (Co layers) and conductive layers (Cu layers) and also exhibiting a large magnetoresistance (see Physical Review Letters, Vol. 66, page 2152, 1991).

The inventors have, however, found that attempts to use an artificial superlattice film as a magnetoresistance device in practical applications have encountered certain problems with regard to maintaining a large magnetoresistance, improving sensitivity, and making the device easy to use.

For example, slight differences between artificial superlattice films as they grow cause slight anisotropic differences of the films even if efforts are made to grow the films under the same conditions. As a result, the produced artificial superlattice films may not exhibit a large magnetoresistance. It is therefore difficult to supply magnetoresistance films of stable characteristics.

In order to obtain a large magnetoresistance, i.e., a large rate of change of resistance, for artificial superlattice films, it is necessary for the external magnetic field to change in the range of from several 100 Oe to 10 kOe, which is larger than the external magnetic field change ranging from 5 to 10 Oe for the Permalloy films. Such a low sensitivity to the external magnetic field makes it impossible to use artificial superlattice films in magnetoresistance devices for magnetic recording, and also limits the range of uses as magnetic sensors.

SUMMARY OF THE INVENTION

It is therefore an object of the present invention to prevent a reduction in a large magnetoresistance due to the anisotropy of magnetic layers in an artificial superlattice film and a magnetoresistance device which incorporates such an artificial superlattice film.

Another object of the present invention is to produce a large change in resistance, i.e., a high sensitivity, in response to a small change in a magnetic field in an artificial superlattice film and a magnetoresistance device which incorporates such an artificial superlattice film.

Still another object of the present invention is to provide an artificial superlattice film which is not required to take into account the direction in which a bias magnetic field is applied in the magnetic sensor of an MR head or the like, which is not required to control the direction of anisotropy when it grows, and which can easily be used as a magnetoresistance device.

Yet another object of the present invention is to provide a method of growing an artificial superlattice film with a stable large magnetoresistance.

According to the present invention, a magnetoresistance film has an artificial lattice film structure having alternating conductive and magnetic layers. The anisotropic magnetic field $H_k$ of the magnetic layers and the anti-ferromagnetic coupling magnetic field $H_s$ between the magnetic layers which face each other through the conductive layers satisfy the relationship $H_k < H_s$. The conductive layers contain 0.05 to 5 atomic % of at least one material selected from the group consisting of iron, cobalt, and nickel. The thickness d of each conductive layer is selected in the range of $1.02 \times d_{max} \leq d \leq 1.10 \times d_{max}$ or $0.90 \times d_{max} \leq d \leq 0.98 \times d_{max}$. The magnetoresistance is exhibited substantially isotropically in the plane of the layers. The magnetoresistance film has large magnetoresistance prevented from being reduced due to the anisotropy of the magnetic layers, a high sensitivity, and keeps its large magnetoresistance stably.

According to the present invention, the magnetoresistance film may be manufactured by depositing conductive and magnetic layers alternately on a substrate to form an artificial lattice film structure by way of a physical deposition process, and applying particles to be deposited at an angle of 30 degrees or less with respect to a direction normal to the substrate. After the artificial lattice film structure has been formed, it may be heat-treated.

The magnetoresistance film may alternatively be manufactured by forming conductive layers by way of a physical deposition process from a source of particles to be deposited which are made of at least one material selected from the group consisting of silver, chromium, copper, and ruthenium, and contain 0.1 to 10 atomic % of at least one material selected from the group consisting of iron, cobalt, and nickel, and alternating the conductive layers with magnetic layers into an artificial lattice film structure.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 9 is a graph showing a characteristic of the magnetoresistance device as it varies depending on the amount of Fe added;

FIG. 10 is a graph showing a characteristic of the magnetoresistance device as it varies depending on the amount of Ni added;

FIG. 16 is a graph showing the relationship between the external magnetic field and the magnetoresistance of the magnetoresistance device;

FIG. 20 is a perspective view of a magnetic sensor structure to which a vertical bias is applied;

FIG. 21 is a perspective view of another magnetic sensor structure to which a vertical bias is applied;

FIG. 22 is a perspective view of still another magnetic sensor structure to which a vertical bias is applied;

DETAILED DESCRIPTION OF THE PREFERRED EMBODIMENTS

Figure 1:
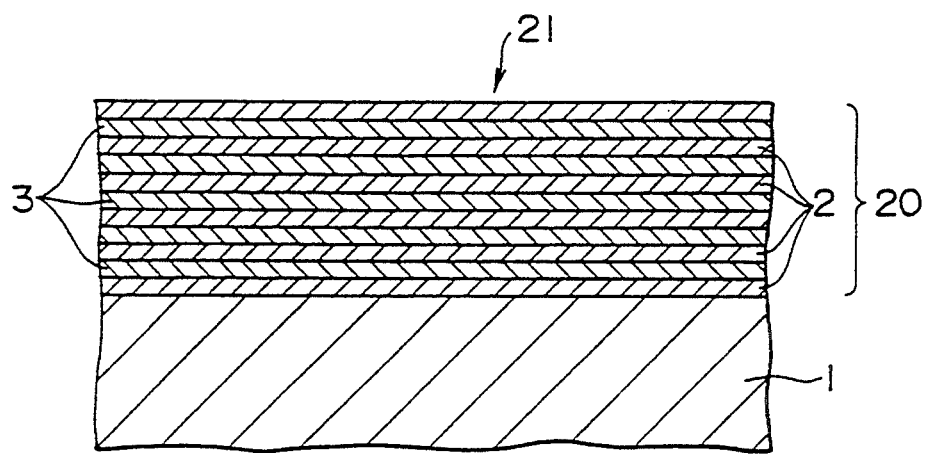
FIG. 1 is an enlarged fragmentary cross-sectional view of a magnetoresistance device according to an example of the present invention.

An artificial superlattice film according to the present invention comprises a magnetic artificial lattice film having a laminated structure composed of n combinations of a ferromagnetic layer A (corresponding to a magnetic layer) having a thickness tA and a nonmagnetic layer B (corresponding to a conductive layer) having a thickness tB, the layers A, B alternating with each other as (2n+1) layers. The magnetic artificial lattice film has a total thickness T in the range of 5 nm≦T≦100 nm. The thicknesses tA, tB are in the ranges of 0.5 nm≦tA, tB≦50 nm. The number n of combinations of the alternating layers A, B is in the range of 1≦n≦30.

The ferromagnetic layer A is made of a conductive material composed of a combination of at least two of the elements Fe, Co, Ni, Cr, V, Mo, Nb, Ta, W, Re, Ru, Cu, Rh, Pd, Ir, Pt, B, C, N, O, Si, Al, Ga, Ge, Sn, and Sb. The ferromagnetic layer A is ferromagnetic at room temperature.

The nonmagnetic layer B is made of a conductive material composed of a combination of at least two of the elements Fe, Co, Ni, Cr, V, Mo, Nb, Ta, W, Re, Ru, Cu, Rh, Pd, Ir, Pt, B, C, N, O, Si, Al, Ga, Ge, Sn, and Sb. The ferromagnetic layer A is nonmagnetic at room temperature.

When the thickness tB of the nonmagnetic layer B is varied with the thickness tA of the ferromagnetic layer A being kept constant, the value of magnetoresistance of the artificial superlattice film varies oscillatingly with respect to the thickness tB of the nonmagnetic layer B. It is preferable to use the other thicknesses tB than the smallest thickness tB among those thicknesses tB where the magnetoresistance has peaks in its oscillating pattern. This is because the bias magnetic field to be applied to the artificial superlattice film may be smaller as the thickness tB of the nonmagnetic layer B is greater.

The inventors have made various studies in an effort to use the artificial superlattice film as a magnetoresistance film, and, as a result, have found some useful discoveries.

The first finding is that a large magnetoresistance can be achieved by controlling the anisotropic magnetic field of the magnetic layers of an artificial lattice structure and the anti-ferromagnetic coupling magnetic field between the magnetic layers which face each other through the conductive layers.

Based on this finding, a magnetoresistance film according to the present invention has an artificial lattice film structure comprising alternating conductive and magnetic layers, wherein the anisotropic magnetic field $H_k$ of the magnetic layers and the anti-ferromagnetic coupling magnetic field $H_s$ between the magnetic layers which face each other through the conductive layers satisfy the relationship $H_k < H_s$, or preferably $2H_k < H_s$.

The above magnetoresistance film may be produced by controlling the direction in which particles are applied to deposit the conductive and magnetic layers. For example, when the conductive and magnetic layers are alternately deposited on a substrate to form the artificial lattice film structure by a physical deposition process, the angle at which the particles are applied with respect to the direction normal to the substrate is selected to be 30 degrees or less.

After the artificial lattice film structure has been formed, it should preferably be subjected to heat treatment. Preferably, the artificial superlattice film structure should be heated to a temperature ranging from 150° to 350° C. for a period of time ranging from 0.5 to 2 hours. The heat treatment process should preferably be carried out in a rotating magnetic field.

The second finding is that the sensitivity of a magnetoresistance film can be increased by adding a certain amount of transition metal to conductive layers.

Based on this finding, a magnetoresistance film according to the present invention has an artificial lattice film structure comprising alternating conductive and magnetic layers each made of at least one material selected from the group consisting of silver, chromium, copper, and ruthenium, the conductive layers containing 0.05 to 5 atomic % of at least one material selected from the group consisting of iron, cobalt, and nickel.

The above magnetoresistance film may be produced by forming conductive layers according to a physical deposition process from a source of particles to be deposited which are made of at least one material selected from the group consisting of silver, chromium, copper, and ruthenium, and contain 0.1 to 10 atomic %, preferably, 0.1 to 5 atomic % of at least one material selected from the group consisting of iron, cobalt, and nickel, and alternating the conductive layers with magnetic layers into an artificial lattice film structure.

The third finding is that the sensitivity to the magnetic field is made higher by selecting the thickness of each layer such that the magnetoresistance is in a certain range near its maximum value than by selecting the thickness of each layer such that the magnetoresistance is of its maximum value.

Based on the third finding, a magnetoresistance film according to the present invention has an artificial lattice film structure comprising alternating conductive and magnetic layers, wherein the thickness d of each conductive layer is selected in the range of:

$$1.02 \times d_{max} \leq d \leq 1.10 \times d_{max}$$

or $$0.90 \times d_{max} \leq d \leq 0.98 \times d_{max}$$

where $d_{max}$ is the thickness of each conductive layer at the time the magnetoresistance is of its maximum value.

It is preferable in the above magnetoresistance film that each of the magnetic layers be made of a magnetic material composed primarily of $Co_xNi_{1-x}$ ($0.05 \leq X \leq 0.9$), and the conductive and magnetic layers be provided in three or more periodic combinations and ten or less periodic combinations.

When a magnetoresistance film whose electric resistance varies as the external magnetic field applied thereto varies is used as a magnetoresistance head for recording information on a recording medium, a magnetic field known as a vertical bias is applied to the magnetoresistance film in the direction in which the information is recorded on the recording medium in order to cause the electric resistance to vary linearly with respect to the external magnetic field. To prevent the electric resistance from suffering noise due to a change in the magnetic internal structure of the magnetoresistance film under the external magnetic field, a bias magnetic field known as a longitudinal bias is applied to the recording medium in the direction of a track width.

In the event that the electric resistance varies owing to the anisotropy or the like of the magnetoresistance film, the bias magnetic fields must be applied in directions to match the varying electric resistance. Stated otherwise, it is necessary to control the anisotropy of the magnetoresistance film depending on the directions of the bias magnetic fields. Such a control procedure is highly cumbersome to carry out.

A further magnetoresistance film according to the present invention has an artificial lattice film structure comprising alternating conductive and magnetic layers, wherein the magnetoresistance is exhibited substantially isotropically in the plane of the layers.

When the magnetoresistance is exhibited substantially isotropically in the plane of the layers, the maximum value of a rate of change $\Delta R$ of the magnetoresistance remains substantially constant in whichever directions a bias magnetic field is applied, i.e., the difference between the maximum value of the rate of change $\Delta R$ of the magnetoresistance when the direction of the applied bias magnetic field agrees with the direction of the magnetic anisotropy of the magnetoresistance film and the maximum value of the rate of change ΔR of the magnetoresistance when the direction of the applied bias magnetic field is perpendicular to the direction of the magnetic anisotropy of the magnetoresistance film, is 10% or less.

To fabricate the above various magnetoresistance films according to the present invention, i.e., to fabricate an artificial lattice film structure by alternately depositing conductive and magnetic layers on a substrate, the temperature of the substrate should preferably be kept at 100° C. or lower, and more preferably be kept at 50° C. or lower.

The magnetoresistance films according to the present invention may be used as a magnetoresistance device in a magnetic sensor or the like, and may also be highly useful as a magnetic sensor in a magnetoresistance magnetic head.

The reason for the large magnetoresistance observed in the artificial lattice film, particularly the artificial superlattice film, of the magnetoresistance device according to the present invention is considered to be an RKKY (Ruderman, Kittel, Kasuya, Yoshida) interaction between the magnetic layers through conduction electrons in the conductive layers to cause the facing magnetic layers to be coupled anti-ferromagnetically thereby giving rise spin-dependent scattering (see, for example, Physical Review Letters, as referred to above, and the Journal of Japan Applied Magnetic Society, Vol. 15, No. 5, pages 813~821, 1991).

The anti-ferromagnetic coupling is generally expressed by $H_s$, and varies depending on the material and layer thickness. The anti-ferromagnetic coupling $H_s$ may be measured by the four-terminal method in the relationship between an external magnetic field and a magnetoresistance as the magnitude of the external magnetic field which saturates the change in the magnetoresistance, i.e., which occurs when the rate of change of the magnetoresistance is maximum.

The inventors have focused attention on the relationship between the anisotropic magnetic field $H_k$ of a magnetic layer and the anti-ferromagnetic coupling $H_s$, and found, as a result of experimentation, that the relationship between the magnitudes of these two parameters has a large effect on the large magnetoresistance. Specifically, the large magnetoresistance can be stably obtained by controlling the anisotropic magnetic field of the magnetic layer such that $H_k < H_s$.

The anisotropic magnetic field $H_k$ may be measured as the magnitude of an external magnetic field required to orient the magnetizing direction into alignment with the direction of an axis of easy magnetization, by a known measuring device such as VSM manufactured by Toei Kogyosha. The anisotropic magnetic field $H_k$ serves to lower the magnetoresistance.

When 0.05 to 5 atomic % of at least one material selected from the group consisting of copper, cobalt, and nickel is contained as a magnetic impurity in a conductive layer made of at least one material selected from the group consisting of silver, chromium, copper, and ruthenium, the RKKY interaction between the magnetic layer is varied to obtain high sensitivity in the vicinity of an external magnetic field which is of a zero value.

The temperature of the substrate at the time the artificial lattice film structure is grown also has a large effect on the large magnetoresistance. Specifically, the rate of change of magnetoresistance is increased by keeping the temperature of the substrate at 100° C. or lower at the time the artificial lattice film structure is grown.

Detailed experimentation on the structure of an artificial superlattice and its materials has revealed that the thickness $d_{max}$ of the conductive layers has a large effect on $H_s$. If the thickness d of the conductive layers lies in the following range:

$$1.02 \times d_{max} \leq d \leq 1.10 \times d_{max}$$

or $$0.90 \times d_{max} \leq d \leq 0.98 \times d_{max},$$

then $H_s$ is reduced, resulting in a magnetoresistance device of high sensitivity. In this case, the relationship $H_k < H_s$ should also be satisfied.

IF each of the magnetic layers of the artificial latticed film is primarily made of an alloy $Co_xNi_{1-x}$ ($0.05 \leq X \leq 0.9$), the artificial latticed film is free of the dependency on the direction in which the biasing magnetic field is applied, and has a good rate of change of the magnetoresistance at all times. No special process is needed to control anisotropy when the magnetoresistance film is grown.

Specific examples of the present invention will be described in detail below with reference to the drawings and experimental results.

EXAMPLE 1

FIG. 1 is shows a magnetoresistance film 20 of an artificial superlattice film structure according to the present invention and a magnetoresistance device 21 which employs the magnetoresistance film 20 therein.

Figure 2:
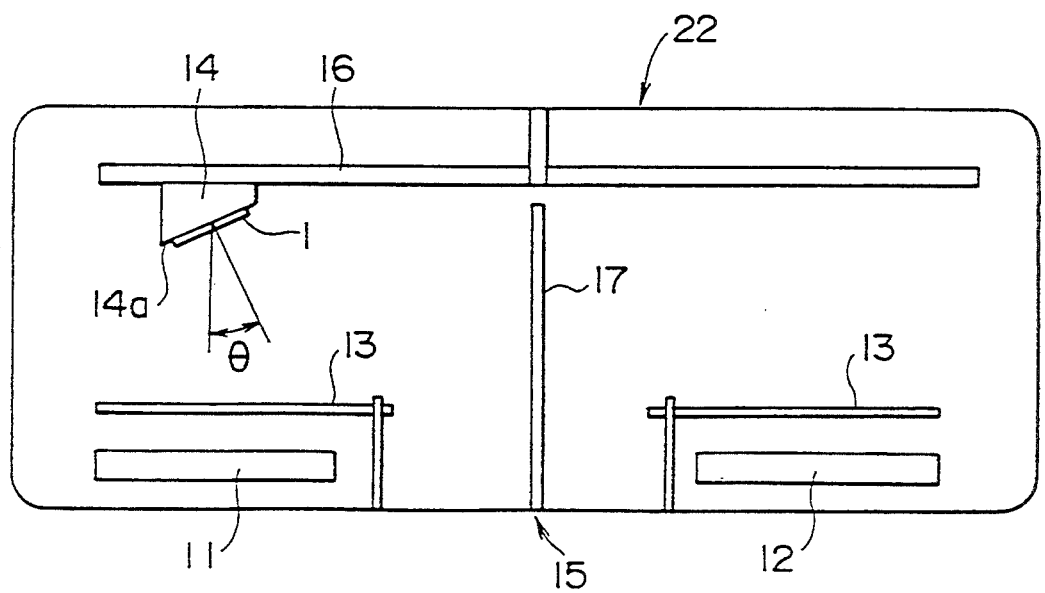
FIG. 2 is a schematic cross-sectional view of an RF magnetron sputtering apparatus which may be used to fabricate the magnetoresistance device.
Figure 3:
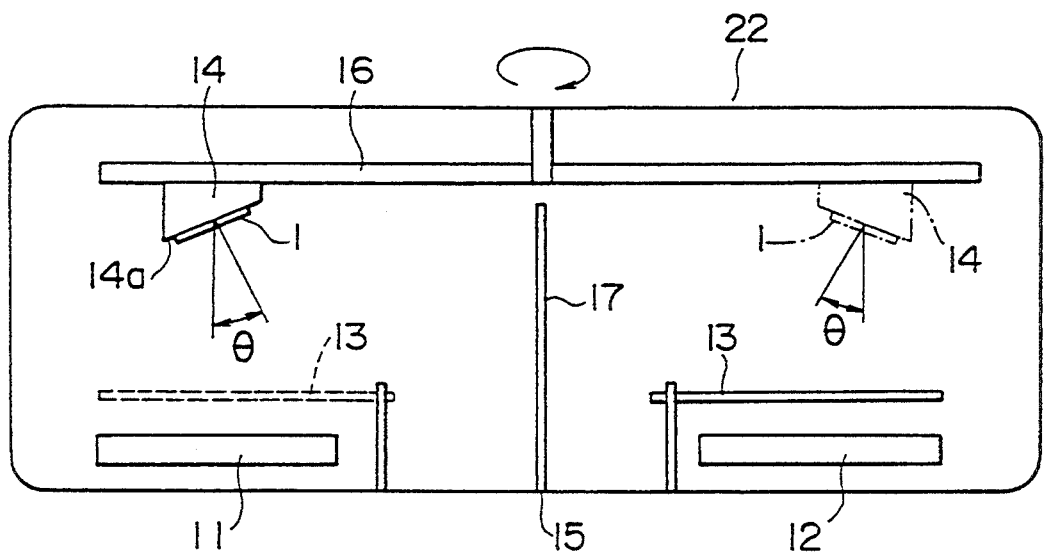
FIG. 3 is a schematic cross-sectional view of the RF magnetron sputtering apparatus when it is in operation.

A substrate 1 was made of glass, and 30 periodic combinations of a magnetic layer 2 and a conductive layer 3 are deposited on the substrate 1 by an RF magnetron sputtering apparatus 22 (see FIGS. 2 and 3). Each magnetic layer 2 was made of Co and had a thickness of 1.0 nm, for example. Each conductive layer 3 was made of Cu and had a thickness of 2.1 nm, for example.

The anisotropic magnetic field $H_k$ of the magnetic layers 2, and the anti-ferromagnetic coupling magnetic field $H_s$ between the magnetic layers 2 that face each other through the conductive layers 2 satisfy the relationship $H_k < H_s$.

The RF magnetron sputtering apparatus 22 shown in FIGS. 2 and 3 was used to fabricate the magnetoresistance device 21.

The RF magnetron sputtering apparatus 22 has a Co target 11, a Cu target 12, shutters 13, a substrate holder 14, and a vacuum housing 15. The substrate holder 14 has an inclined surface 14a confronting the target, and the substrate 1 is fixed to the inclined surface 14a. The substrate 1 fixed to the inclined surface 14a is inclined at an angle $\theta$ to a line normal thereto. The angle $\theta$ corresponds to an angle at which particles sputtered from the target are applied.

The direction in which the sputtered particles are deposited on the substrate 1, i.e., the magnetic anisotropy $H_k$ of the magnetic layers, can be controlled by the angle $\theta$. The particles were sputtered in a sputtering gas of Ar under a gas pressure of 0.5 Pa at a layer growth rate ranging from 0.1 to 0.5 nm/sec. while the substrate 1 was being kept at a temperature of 25° C. The thickness of each of the layers was controlled by opening and closing the shutters 13.

The RF magnetron sputtering apparatus is designed to increase the sputtering efficiency of the targets with a magnet (not shown). To deposit each of the layers, one of the shutters 13 is opened as indicated by the broken lines, and the target 11 is sputtered to deposit the Co magnetic layer 2 at the angle $\theta$ on the substrate 1 positioned directly above the target 11. Thereafter, the substrate holder 14 is moved into a vacuum chamber in the opposite side of a partition wall 17, as indicated by the imaginary lines, by rotating an attachment plate 16 on which the substrate holder 14 is mounted. Then, the shutter 13 is opened, and the target 12 is sputtered to deposit the Cu conductive layer 3 on the magnetic layer 2 at the angle $\theta$. The above cycle is repeated a predetermined number of times to form a laminated film structure as shown in FIG. 1.

Figure 4:
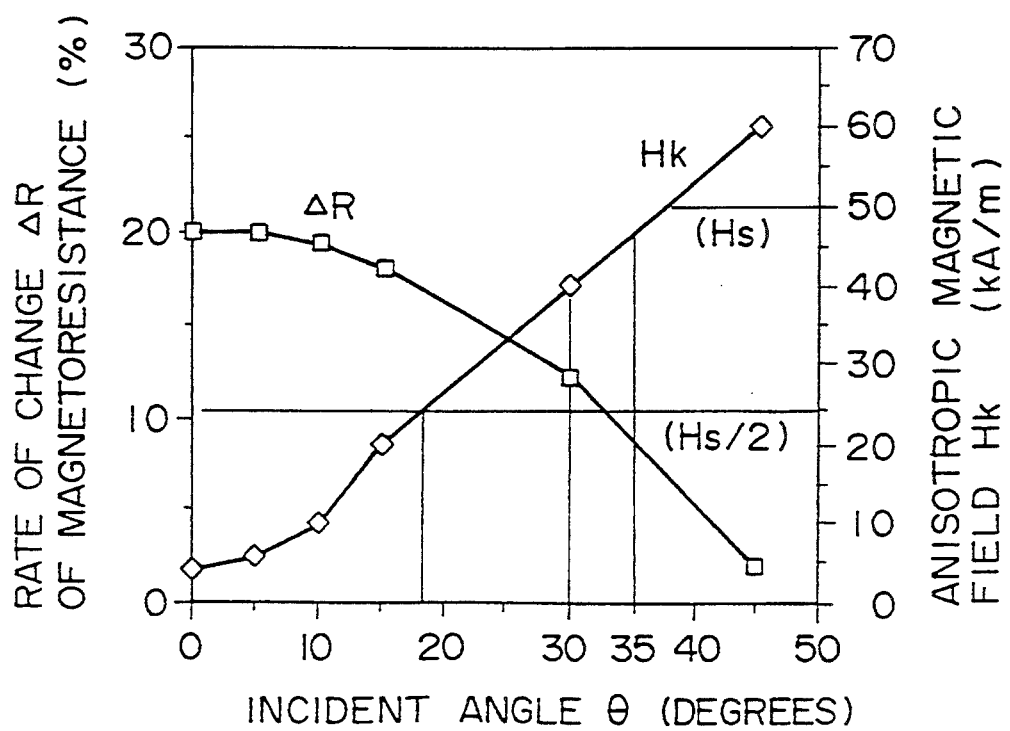
FIG. 4 is a graph showing characteristics of the magnetoresistance device as they change depending on the angle at which particles to be deposited are applied.

When the angle $\theta$ at which the particles were applied, i.e., the incident angle, was varied, the maximum value of the rate of change $\Delta R$ of the magnetoresistance and the anisotropic magnetic field $H_k$ as they depend on the angle $\theta$ were measured. The results of the measurement are shown in FIG. 4. When the angle $\theta$ was zero, the particles were applied perpendicularly to the substrate.

The magnetoresistance was measured by the four-terminal method with respect to a specimen having a width of 5 mm and a length of 10 mm. The rate of change $\Delta R$ of the magnetoresistance was calculated according to a formula $\Delta R = (R - R_o)/R_o$ where R is the resistance under a certain external magnetic field and Ro is the resistance under an external magnetic field of 1 kOe.

The graph of FIG. 4 indicates that as the incident angle is increased, the anisotropic magnetic field $H_k$ is increased, and the maximum value of rate of change of the magnetoresistance is reduced. In this example, $H_s$ was about 50 kA/m. When the incident angle exceeds 30 degrees (furthermore 35 degrees), the relationship $H_k < H_s$ is no longer satisfied, and no large magnetoresistance can be observed.

To obtain a good large magnetoresistance reliably, it is necessary to keep the incident angle at 30 degrees or lower. Under such an angle condition, the relationship $H_k < H_s$ can easily be achieved, and a large rate of change $\Delta R$ of the magnetoresistance can be obtained. The incident angle should more preferably be 25 degrees or less.

For a much larger rate of change $\Delta R$ of the magnetoresistance, it is preferable that the relationship $H_k < H_s/2$ be satisfied, with the incident angle being 20 degrees or smaller.

As described above, the anisotropy $H_k$ of the magnetic layers is reduced and the relationship $H_k < H_s$ is reliably achieved for greater $\Delta R$ by varying the incident angle $\theta$ of sputtering particles, particularly to the range of $\theta \leq 30$ degrees for film fabrication. This is a novel feature that the inventors have found at first.

The fabrication of a superlattice film according to the above sputtering process is a very useful process among various film fabrication processes, because the sputtering process allows a high film fabrication rate, easy adjustment of film fabricating conditions (e.g., the pressure of Ar and the applied voltage), and a lower cost.

Figure 5A:
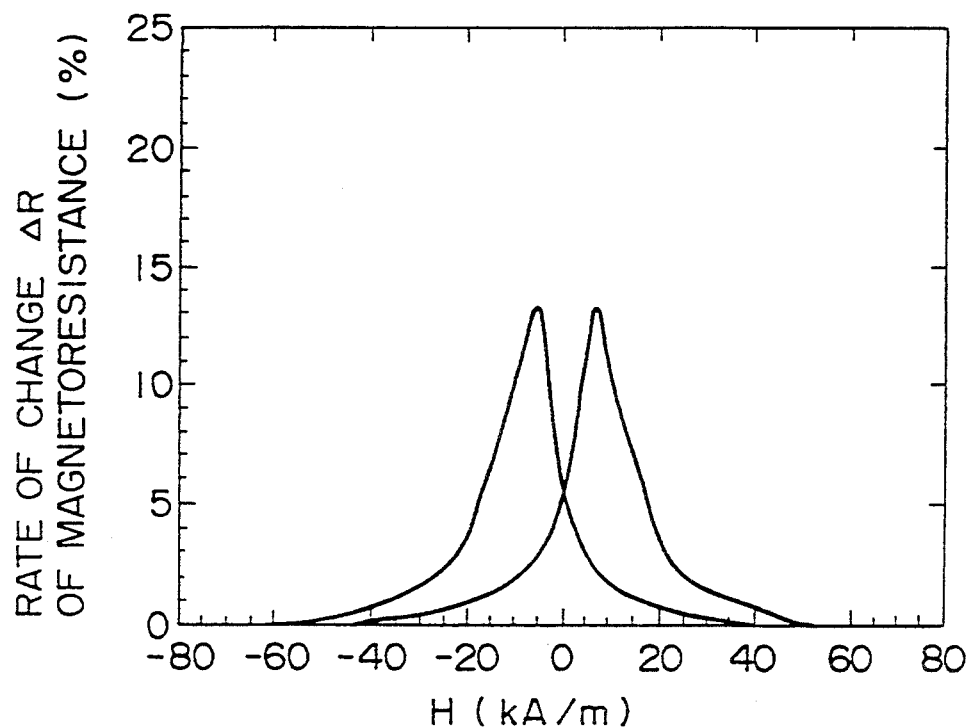
FIG. 5(A) is a graph showing a characteristic of the magnetoresistance device as it varies depending on the external magnetic field applied in heat treatment.
Figure 5B:
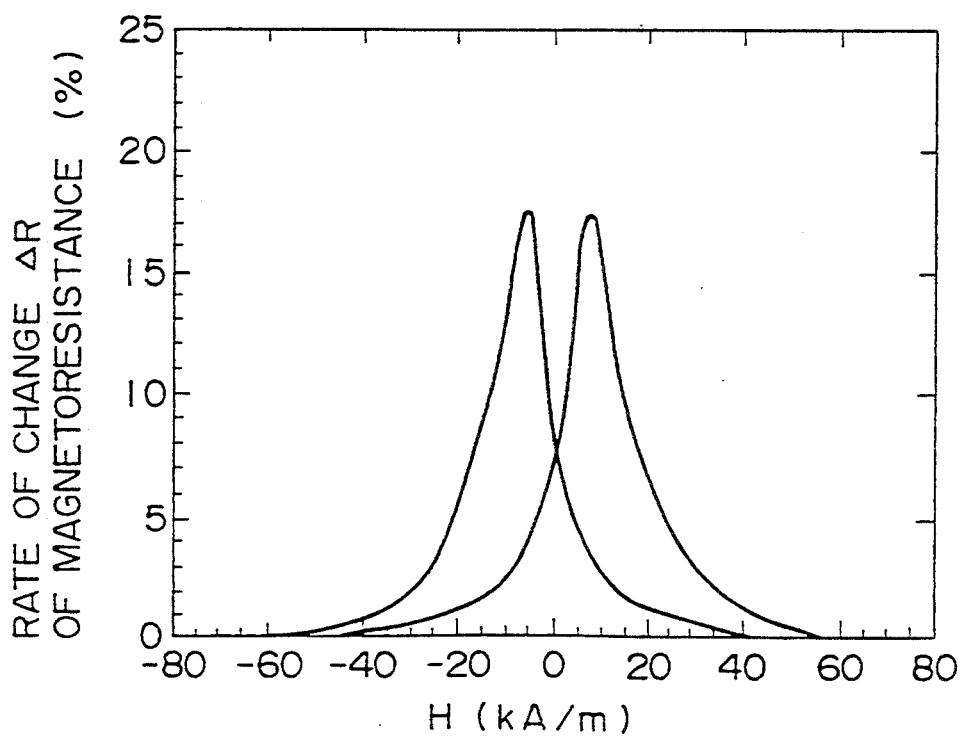
FIG. 5(B) is a graph showing a characteristic of the magnetoresistance device as it varies depending on the external magnetic field applied after heat treatment.

FIGS. 5(A) and 5(B) show the relationship between the external magnetic field and the rate of change of the magnetoresistance when the magnetoresistance device was subjected to heat treatment in a rotating magnetic field after the films were fabricated by sputtering. FIG. 5(A) shows the characteristic before the heat treatment, and FIG. 5(B) shows the characteristic upon the heat treatment at 250° C. for 1.5 hours.

It can be seen from the results shown in FIGS. 5(A) and 5(B) that the anisotropic magnetic field $H_k$ is reduced, and the maximum value of rate of change of the magnetoresistance is increased, i.e., the large magnetoresistance is further increased, by the heat treatment in a rotating magnetic field.

It is preferable to effect the heat treatment at 150° to 350° C. for 0.5 to 2 hours. If the temperature of the heat treatment is lower than 150° C. then it would be difficult to increase the rate of change $\Delta R$ of the magnetoresistance. If the temperature of the heat treatment is in excess of 350° C., then it would also be difficult to increase the rate of change $\Delta R$ of the magnetoresistance because atoms would be diffused between the conductive and magnetic layers due to the high temperature, tending to lower the peak of the rate of change $\Delta R$ of the magnetoresistance.

Figure 6:
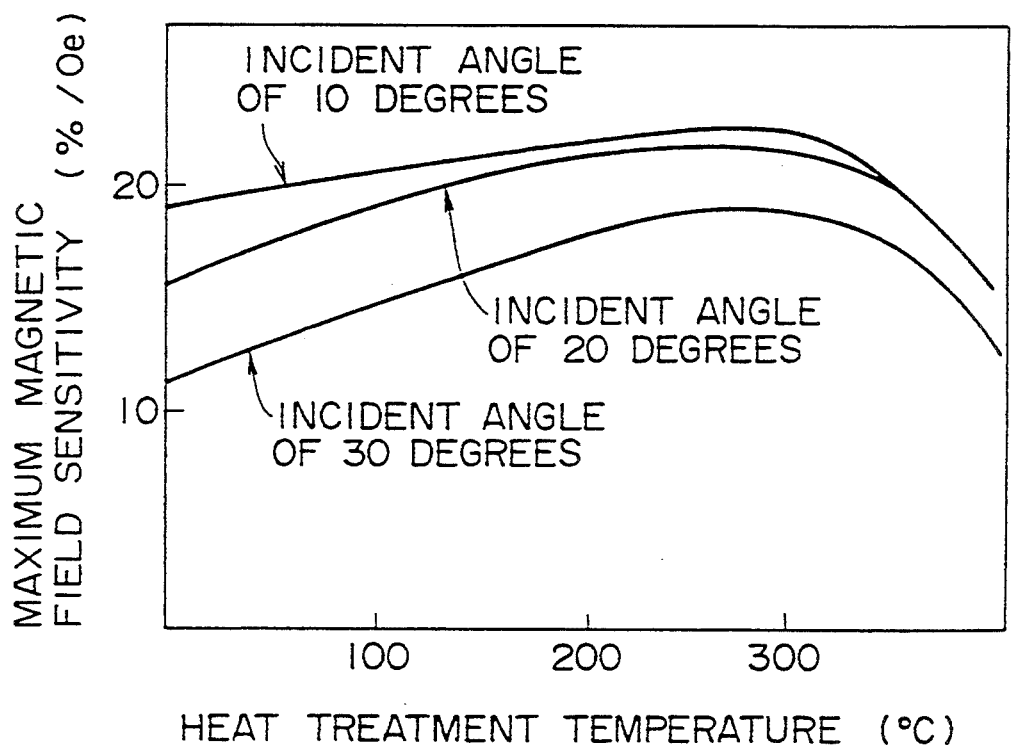
FIG. 6 is a graph showing a characteristic of the magnetoresistance device as it varies depending on the temperature of heat treatment at various angles at which particles to be deposited are applied.

The maximum value (relative value) of the magnetic field sensitivity depending on the temperature of the heat treatment (which continued for 2 hours) at each incident angle is shown in FIG. 6. The magnetic field sensitivity is defined as a differential of the rate of change $\Delta R$ of the magnetoresistance with respect to the external magnetic field, as indicated by a formula $S = d(\Delta R)/dH$.

It can be understood that the sensitivity varies depending on the temperature of the heat treatment, i.e., the sensitivity is good at a temperature ranging from 150° to 350° C. and tends to drop to a large degree at a temperature exceeding 350° C. The sensitivity is also governed by the incident angle of sputtering particles, i.e., is good when the incident angle is 30 degrees or lower, and better when the incident angle is 20 degrees or lower.

EXAMPLE 2

In this example, the composition of a target for depositing conductive layers is modified when the superlattice film shown in FIG. 1 is grown by the RF magnetron sputtering apparatus. Example 2 will be described below with reference to FIGS. 7(A) and 7(B) through 10.

The target 11 comprised a Co target for depositing magnetic layers each 1.0 nm thick as with Example 1. The target 12 for depositing conductive layers was made of Cu with 0.1 to 10 at % of Co added thereto. Conductive layers 3 of Cu with 0.05 to 5 at % of Co, each 2.1 nm thick, were deposited by the target 12. In this example, the particles were applied to the substrate at the incident angle $\theta$ of 0. For comparison, a specimen with no Co added to Cu was also fabricated under the same conditions according to the conventional process.

Figure 7A:
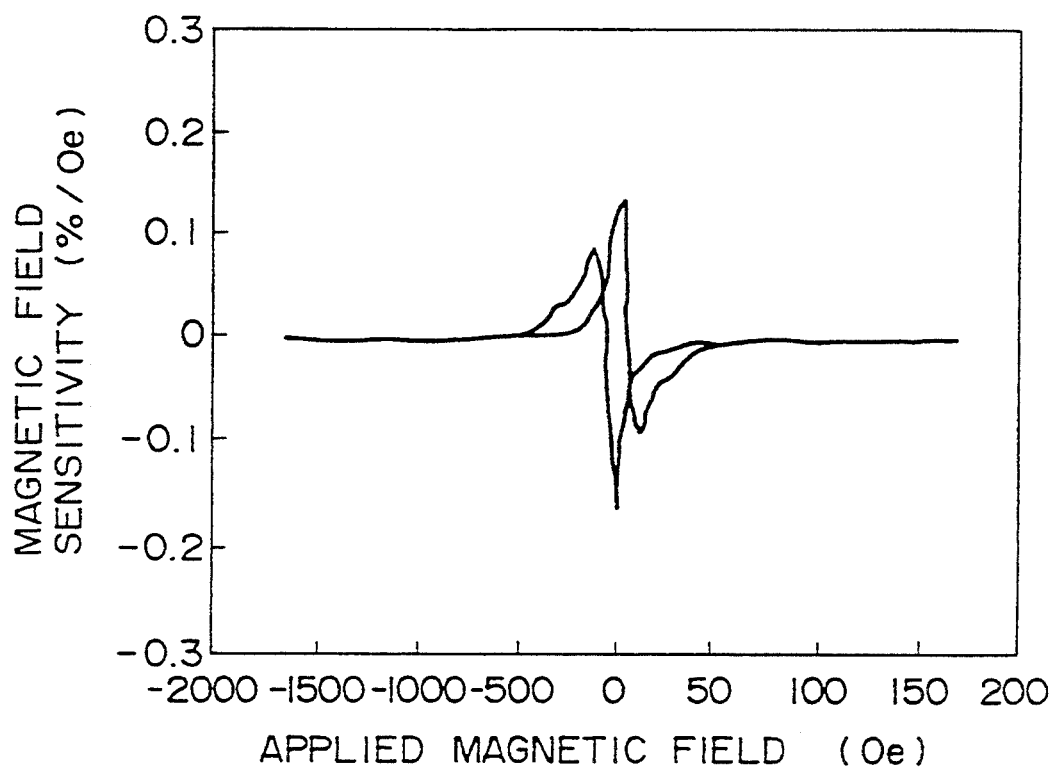
FIG. 7(A) is a graph showing a characteristic of a magnetoresistance device as it varies depending on the external magnetic field applied, the magnetoresistance device having a conductive layer with no Co added.
Figure 7B:
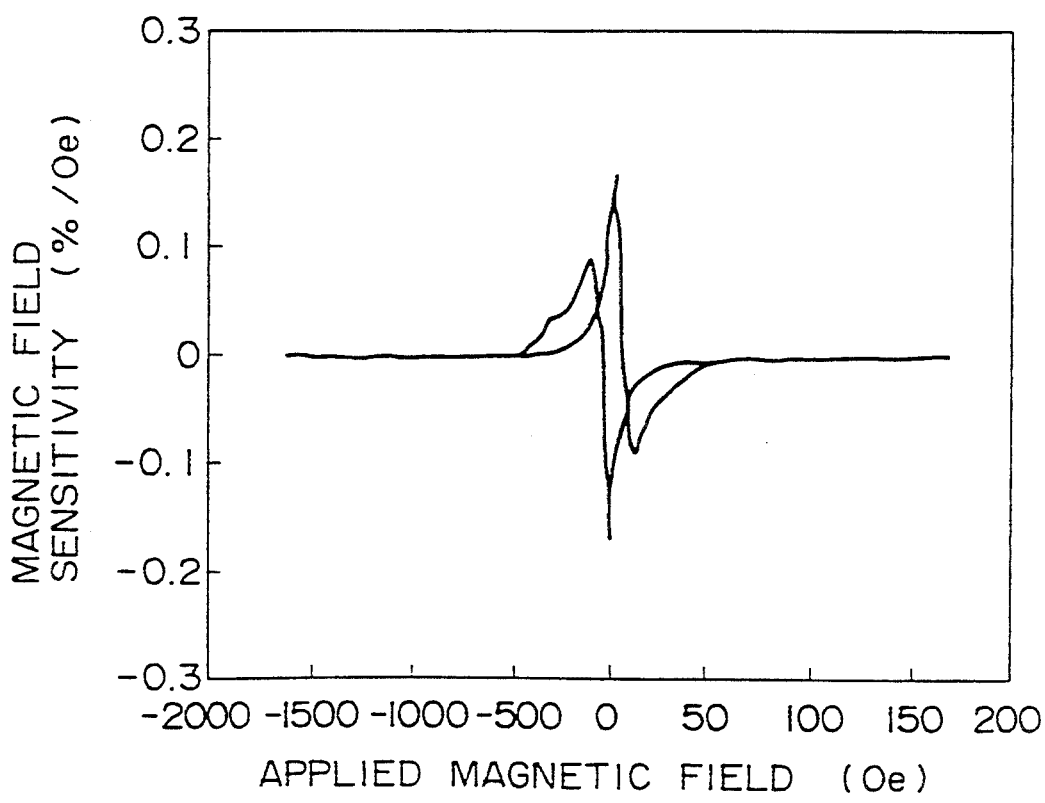
FIG. 7(B) is a graph showing a characteristic of a magnetoresistance device as it varies depending on the external magnetic field applied, the magnetoresistance device having a conductive layer with Co added.

FIG. 7(A) shows the relationship between the external magnetic field and the sensitivity of the conventional artificial superlattice film with no Co added to the Cu conductive layers, and FIG. 7(B) shows the relationship between the external magnetic field and the sensitivity of an artificial superlattice film having conductive layers with 1 at % of Co added (2 at % of Co added in the target composition).

The magnetoresistance was measured by the four-terminal method with respect to a specimen having a width of 5 mm and a length of 10 mm. The rate of change $\Delta R$ of the magnetoresistance was calculated according to a formula $\Delta R=(R-Ro)/Ro$ where R is the actual resistance and Ro is the resistance under an external magnetic field of $1.6\times 10^6$ kA/m. The magnetic field sensitivity is defined as a differential of the rate of change $\Delta R$ of the magnetoresistance with respect to the external magnetic field, as indicated by a formula $S=d(\Delta R)/dH$.

As is apparent from FIG. 7, the magnetic field sensitivity of the artificial superlattice film according to the present invention, with a certain amount of Co contained as a magnetic additive in the conductive layers, is high when the external magnetic field is in the vicinity of zero. This indicates that the magnetoresistance device is highly effective for use as a magnetic head for magnetic recording or a magnetic sensor.

Figure 8:
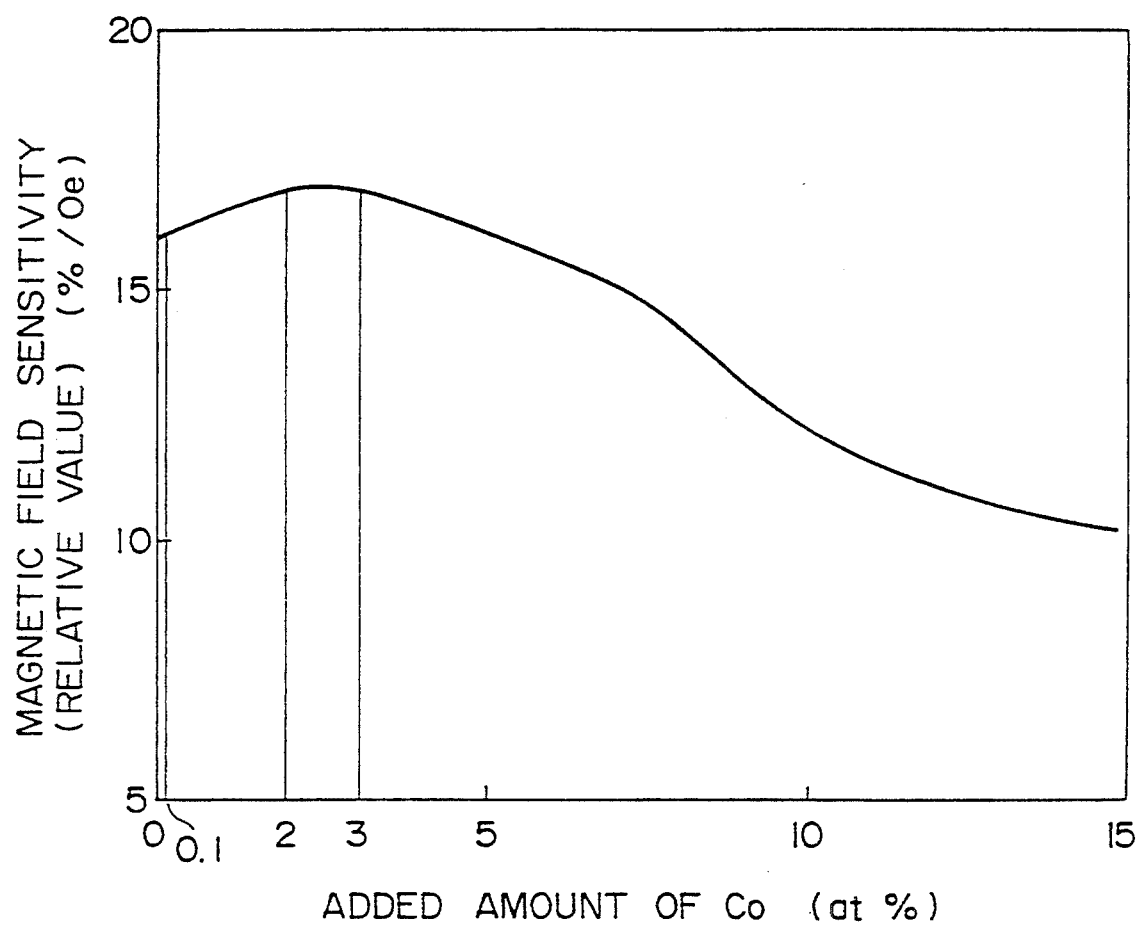
FIG. 8 is a graph showing a characteristic of the magnetoresistance device as it varies depending on the amount of Co added.

FIG. 8 shows how the maximum value of the magnetic field sensitivity varies depending on the amount of Co added to the target 12. When the added amount of Co exceeds a certain value, the magnetic field sensitivity falls because the maximum value of the rate of change of the magnetoresistance decreases as Co is added. When the added amount of Co ranges from 0.1 to 10 at %, the sensitivity is increased. The sensitivity is higher when the added amount of Co ranges from 0.1 to 5 at %. It can be seen that the optimum amount of added Co ranges from about 2 to 3 at %, and the maximum magnetic field sensitivity in that range is about 17 % Oe. The amount of Co added to the conductive layers ranges from 0.05 to 5 at %, preferably from 0.05 to 2.5 at %, and optimally from about 1 to 1.5 at %.

In the superlattice film structure according to Example 2, if a highly thin transition layer due to diffused atoms is produced at the interface between conductive and magnetic layers, then such a transition layer may not be contained in a conductive layer which contains 0.05 to 5 at % of Co. According to the present invention, the concentration of Co in the conductive layers is substantially constant throughout the layers, and such layers are referred to as conductive layers.

The magnetic element added to the target 12 was changed from Co to Fe and Ni, and conductive layers were deposited in the same manner as described above, thus forming superlattice films. FIGS. 9 and 10 show how the maximum value of the magnetic field sensitivity varies depending on the amount of Fe and Ni added to the target 12.

It can be seen from FIGS. 9 and 10 that the magnetic field sensitivity increases when the added amount of Fe and Ni ranges from 0.1 to 10 at % or preferably from 0.1 to 5 at %, and increases greatly when the added amount of Fe ranges from 0.3 to 2 at % and the added amount of Ni ranges from 1.5 to 6 at %.

EXAMPLE 3

In this example, the temperature of the substrate in the above sputtering process was modified. Example 3 will be described below with reference to FIGS. 11 and 12.

Figure 11:
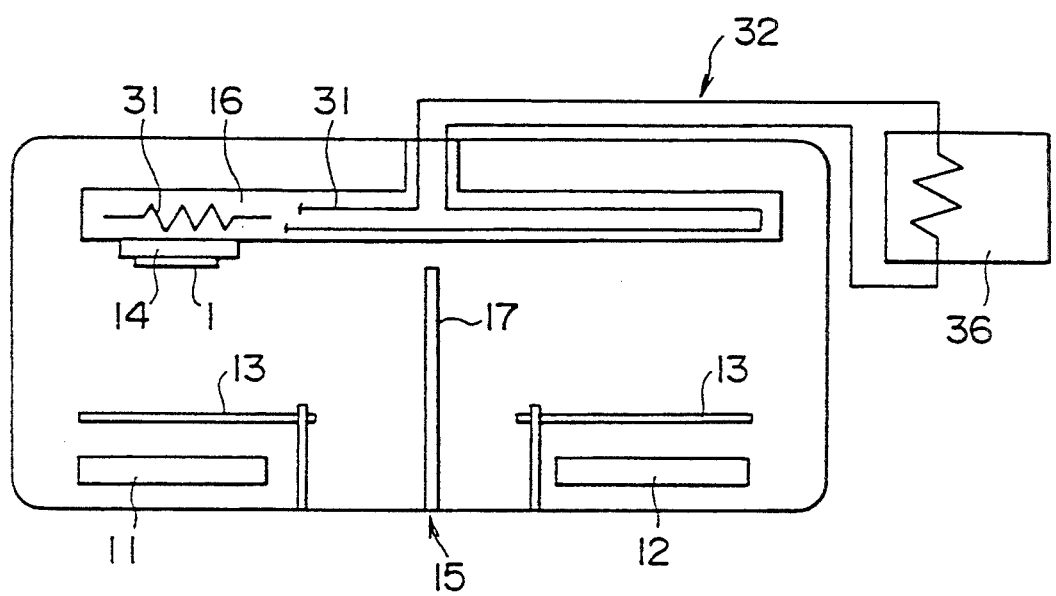
FIG. 11 is a schematic cross-sectional view of an RF magnetron sputtering apparatus which may be used to fabricate a magnetoresistance device according to another example of the present invention.

As shown in FIG. 11, an RF magnetron sputtering apparatus 32 has a substrate 1 lying substantially parallel to the target, i.e., the incident angle of sputtering particles is about 0. The RF magnetron sputtering apparatus 32 differs from the above RF magnetron sputtering apparatus in that a substrate heating device 30 and a coolant conduit 31 extending from a cooling device 36 are disposed in the rotatable attachment plate 16 for controlling the temperature of the substrate 1 as desired.

The heating device 30 may comprise a normal resistance heater, and the cooling device 36 may comprise a normal heat exchanger. The coolant may comprise water, ethylene glycol, or the like. Only a portion of the coolant conduit 31 is shown in FIG. 11.

Figure 12:
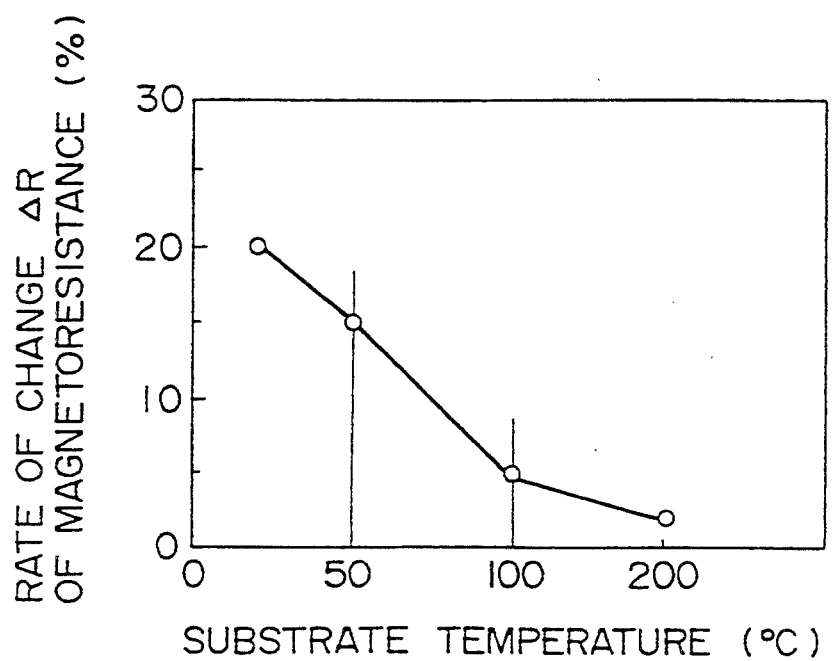
FIG. 12 is a graph showing a characteristic of the magnetoresistance device as it varies depending on the temperature of the substrate thereof.

The maximum value of the rate of change $\Delta R$ of the magnetoresistance at the time the layers were fabricated when the temperature of the substrate 1 was varied by the heating device 30 and the coolant conduit 31 is shown in FIG. 12.

The rate of change $\Delta R$ of the magnetoresistance was measured in the same manner as in Example 1. The results shown in FIG. 12 indicate that when the temperature of the substrate is increased, the maximum value of the rate of change $\Delta R$ of the magnetoresistance is reduced, and when the temperature of the substrate is 100° C. or higher, the maximum value of the rate of change $\Delta R$ of the magnetoresistance is reduced to 5% or less. To obtain a larger rate of change $\Delta R$ of the magnetoresistance, the temperature of the substrate 1 should be 100° C. or lower, preferably 50° C. or lower, or more preferably 25° C. or lower.

Only when the heating device 10 is in operation, the temperature of the substrate 1 is 100° C. or higher. When both the heating device 30 and the coolant conduit 31 are used, the temperature of the substrate 1 ranges from 50° to 100° C. When the heating device 30 is turned off and the coolant at a temperature ranging from 15° to 25° C. flows through the coolant conduit 31, the temperature of the substrate 1 is 50° C. or lower.

As described above, the rate of change $\Delta R$ of the magnetoresistance is increased to achieve stable magnetoresistance by keeping the temperature of the substrate 1 at 100° C. or lower.

EXAMPLE 4

In FIG. 4, the substrate 1 was made of glass, and 10 periodic combinations of a magnetic layer 2 and a conductive layer 3 are deposited on the substrate 1 by the above RF magnetron sputtering apparatus. Each magnetic layer 2 was made of an alloy $Co_{0.7}Ni_{0.3}$, and had a thickness of 1.0 nm, for example. Each conductive layer 3 was made of Cu. The particles were sputtered in a sputtering gas of Ar under a gas pressure of 0.5 Pa at a layer growth rate ranging from 0.1 to 0.5 nm/sec. while the substrate 1 was being kept at a temperature of 25° C.

When the thickness of the conductive layers 3 was varied, the saturated magnetic field $H_s$, the rate of change $\Delta R$ of the magnetoresistance, and the ratio $\Delta R/H_s$ indicating the sensitivity were measured. The results of the measurement are shown in FIG. 13.

The saturated magnetic field and the magnetoresistance were measured in an external magnetic field by the DC four-terminal method with respect to a specimen having a width of 5 mm and a length of 20 mm. The rate of change $\Delta R$ of the magnetoresistance was calculated according to a formula $\Delta R=(R_{max}-Ro)/Ro$ where $R_{max}$ is the maximum resistance When the magnetic field is varied, and Ro is the resistance under an external magnetic field of 1 kOe.

Figure 13:
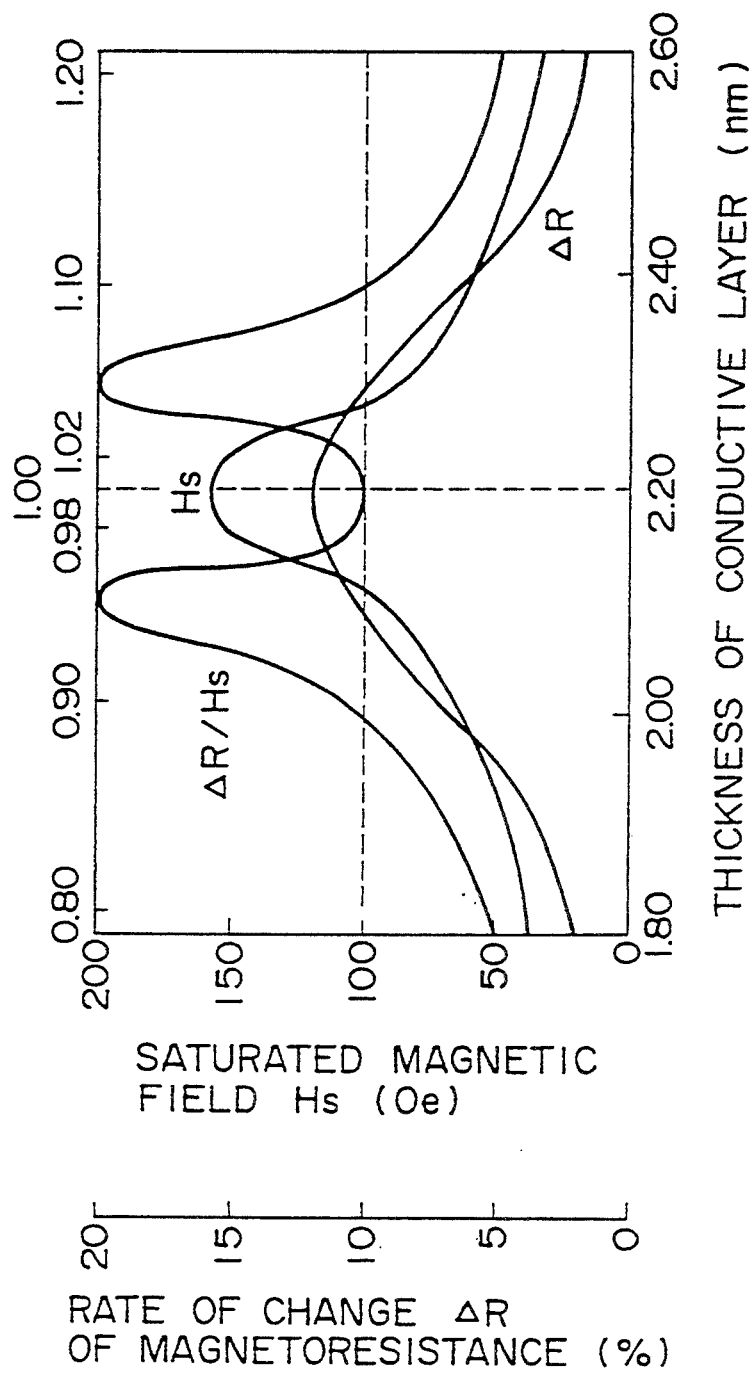
FIG. 13 is a graph showing a saturated magnetic field $H_S$, a rate of change $\Delta R$ of magnetoresistance, and a ratio $\Delta R/H_S$ indicating a sensitivity, as they vary depending on the thickness of a conductive layer of a magnetoresistance device according to still another example of the present invention.

It will be understood from FIG. 13 that the thickness $d_{max}$ of the conductive layers 3 for maximum $H_s$ is 2.20 nm, and the saturated magnetic field $H_s$ is reduced if the thickness d is smaller than the thickness $d_{max}$, and that the rate of change of the magnetoresistance is reduced as the thickness of the conductive layers is reduced. Therefore, it can be seen that the ratio $\Delta R/H_s$ indicating the sensitivity is of a maximum value in the vicinity of $d=0.95\times d_{max}$ or $d=1.05\times d_{max}$.

Consequently, in order to reduce the saturated magnetic field while keeping the rate of change of the magnetoresistance at a high level to obtain a high sensitivity, it is necessary to select the thickness d of the conductive layers to satisfy the range: $1.02\times d_{max}\leq d\leq 1.10\times d_{max}$, or $0.90\times d_{max}\leq d\leq 0.98\times d_{max}$.

EXAMPLE 5

The composition of the magnetic layers 2 of the artificial lattice film shown in FIG. 1 was modified, and the saturated magnetic field $H_s$, the rate of change $\Delta R$ of the magnetoresistance, and the ratio $\Delta R/H_s$ indicating the sensitivity were measured. The results of the measurement are shown in FIG. 14.

Figure 14:
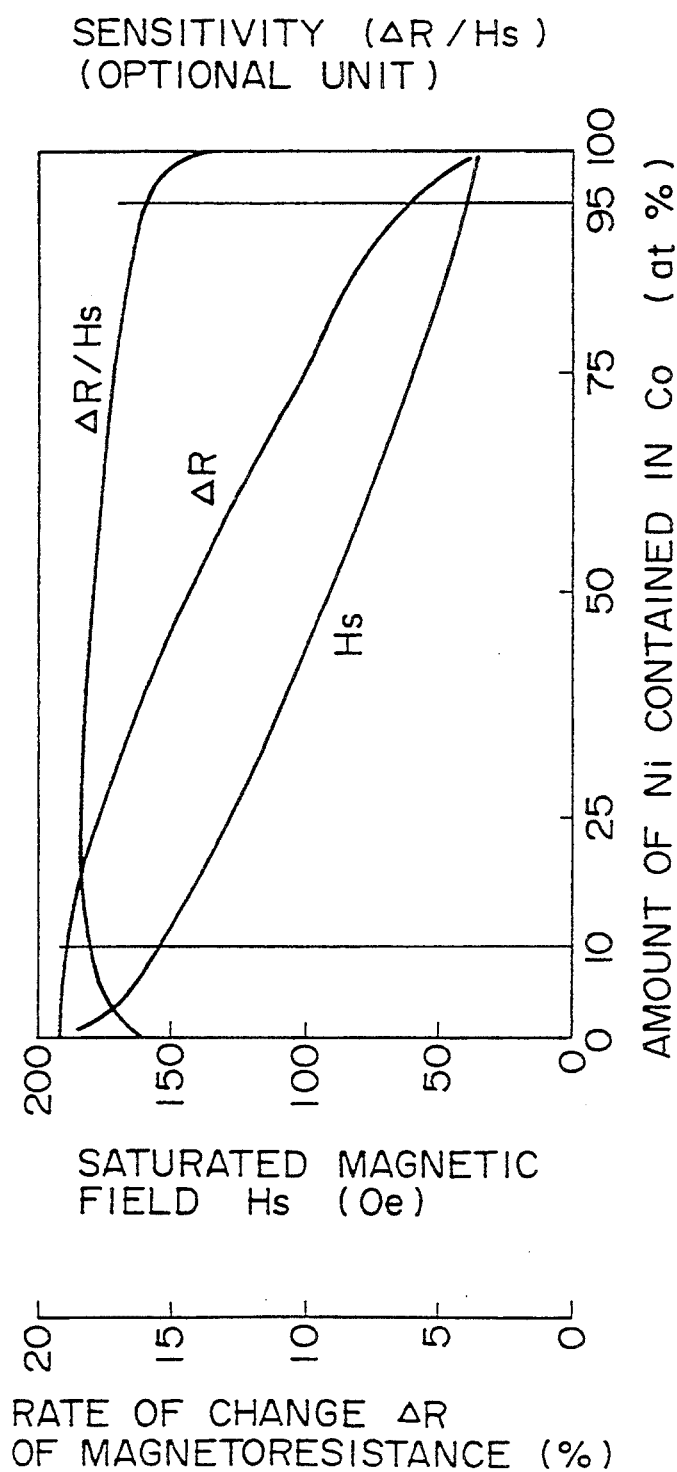
FIG. 14 is a graph showing the saturated magnetic field $H_S$, the rate of change $\Delta R$ of magnetoresistance, and the ratio $\Delta R/H_S$ as they vary depending on the composition of a magnetic layer of a magnetoresistance device according to yet another example of the present invention.

A review of FIG. 14 indicates that when Ni is added to Co, the saturated magnetic field $H_s$ is reduced, and so is the rate of change $\Delta R$ of the magnetoresistance. The ratio $\Delta R/H_s$ indicating the sensitivity has a maximum value in the vicinity of the composition $Co_{0.7}Ni_{0.3}$, and becomes lower than with pure Co if the added amount of Ni exceeds 90 atomic %. That is, the sensitivity is high then the composition of the magnetic layers is $CO_xNi_{1-x}$ ($0.05\leq X\leq 0.9$).

EXAMPLE 6

Figure 15:
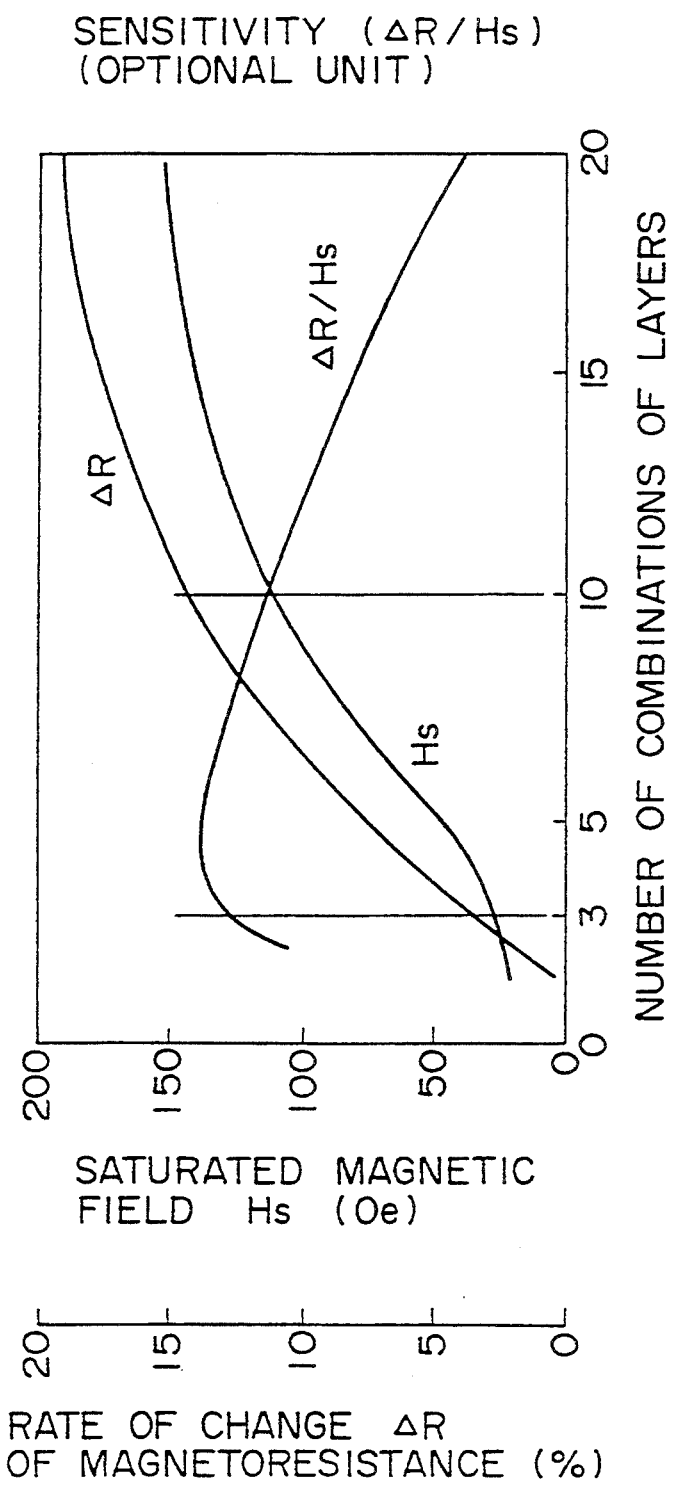
FIG. 15 is a graph showing the saturated magnetic field $H_S$, the rate of change $\Delta R$ of magnetoresistance, and the ratio $\Delta R/H_S$ as they vary depending on the number of periodic layer combinations of a magnetoresistance device according to yet still another example of the present invention.

The number of periodic combinations of the magnetic and conductive layers 2, 3 of the above artificial lattice film was modified, and the saturated magnetic field $H_s$, the rate of change $\Delta R$ of the magnetoresistance, and the ratio $\Delta R/H_s$ indicating the sensitivity were measured. The results of the measurement are shown in FIG. 15. Each magnetic layer 2 was made of an alloy $Co_{0.7}Ni_{0.3}$, and each conductive layer 3 had a thickness d of 2.00 mm so that $d=0.95\times d_{max}$.

It can be seen from FIG. 15 that as the number of periodic combinations of the magnetic and conductive layers 2, 3 is reduced, the saturated magnetic field $H_s$ is reduced, and so is the rate of change $\Delta R$ of the magnetoresistance. The ratio $\Delta R/H_s$ indicating the sensitivity has a maximum value when the number of periodic combinations of the magnetic and conductive layers 2, 3 is 4. When a sensitivity reduction to 50% with respect to the maximum ratio $\Delta R/H_s$ is allowed, the necessary sensitivity is achieved by selecting the number of periodic combinations of the magnetic and conductive layers 2, 3 to be 3 or greater and 10 or smaller.

FIG. 16 shows the relationship between the external magnetic field and the magnetoresistance of the magnetoresistance device with the artificial lattice film where the number of periodic combinations of the magnetic and conductive layers 2, 3 is 4. It can be seen that a saturated magnetic field $H_s$ of 30 Oe and a rate of change $\Delta R$ of 5% are accomplished.

EXAMPLE 7

In this example, magnetoresistance films with and without anisotropy were grown under the following conditions, and the characteristics of the magnetoresistance films with and without anisotropy were checked.

Particles for depositing layers to form the magnetoresistance film with anisotropy were sputtered in a sputtering gas of Ar under a gas pressure of 0.5 Pa at a layer growth rate ranging from 0.1 to 0.5 nm/sec. while the substrate 1 was being kept at a temperature of 25° C. The incident angle, i.e., the angle of inclination of the substrate, was 30°.

The magnetoresistance film without anisotropy was fabricated under the same conditions as those for forming the magnetoresistance film with anisotropy, except that the incident angle was 0°.

For comparison, a Permalloy film was grown by sputtering in a sputtering gas of Ar under a gas pressure of 0.5 Pa at a layer growth rate ranging from 0.1 to 0.5 nm/sec. while the substrate 1 was being kept at a temperature of 25° C. The incident angle was 0°. The film was grown in a magnetic field in order to impart anisotropy.

Figure 17:
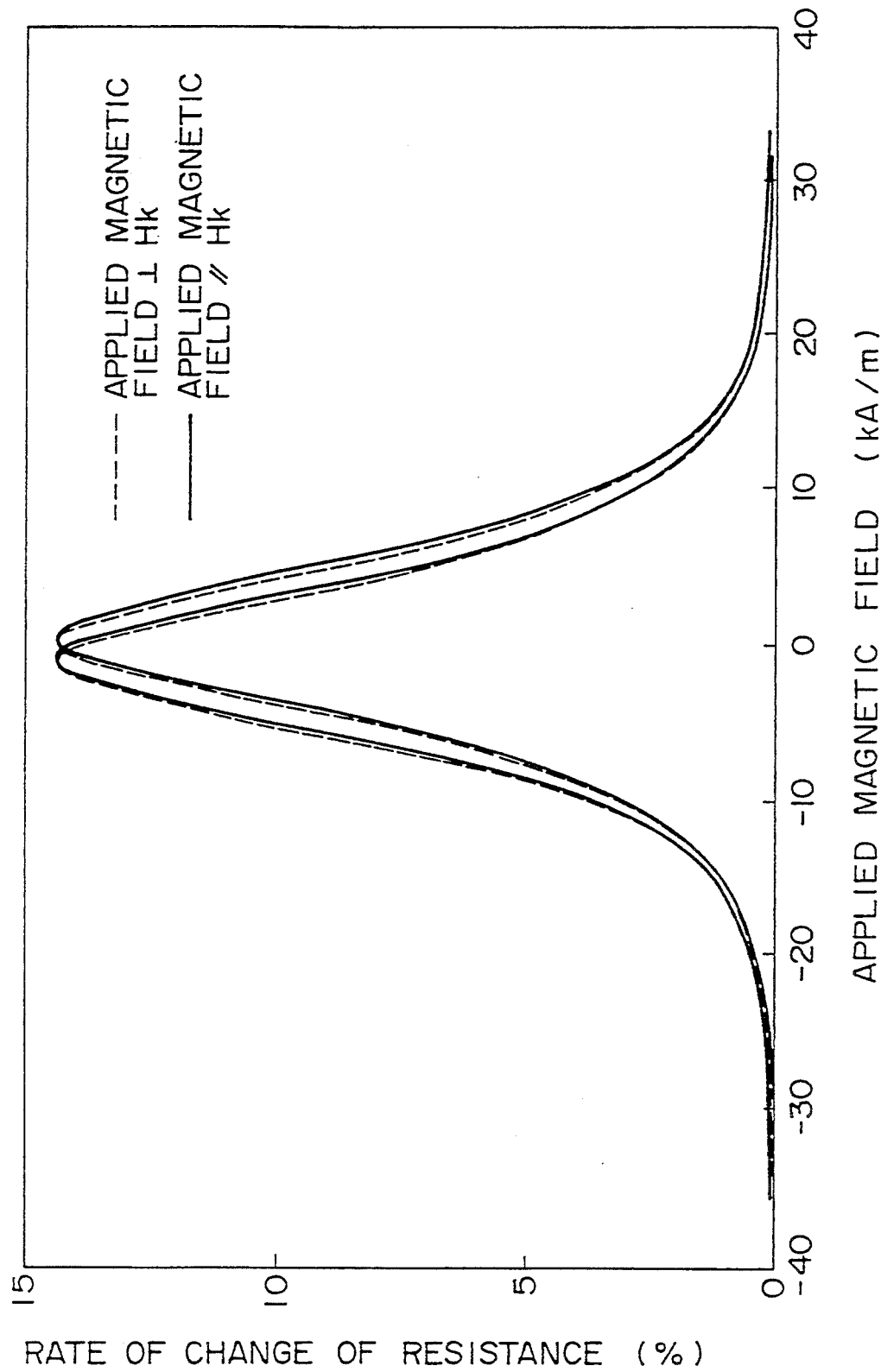
FIG. 17 is a graph showing the magnetoresistance of a GMR film with no anisotropy as it depends on a bias magnetic field applied whose direction is changed with respect to the magnetic anisotropic direction of the GMR film.
Figure 18:
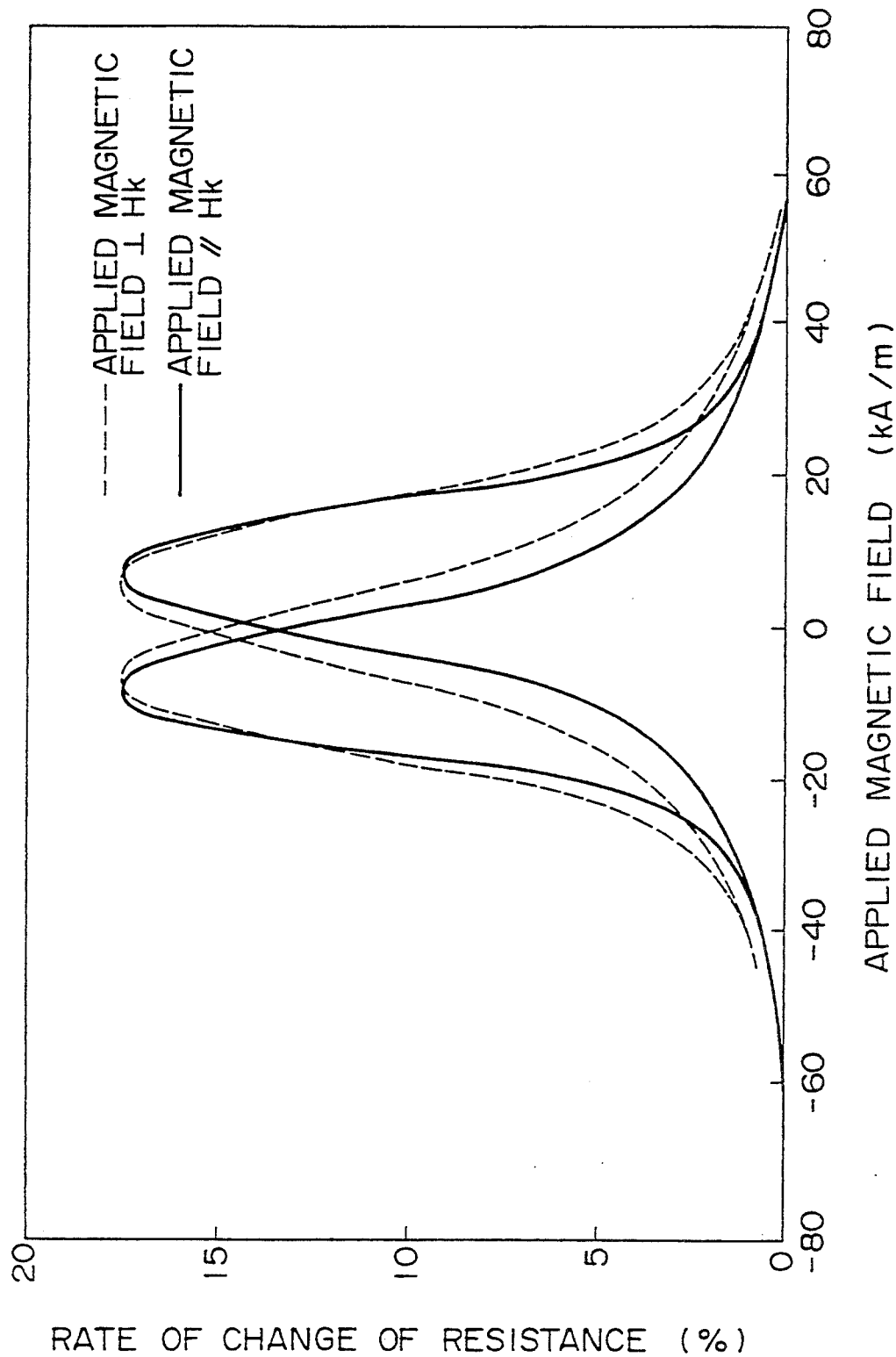
FIG. 18 is a graph showing the magnetoresistance of a GMR film with anisotropy as it depends on a bias magnetic field applied whose direction is changed with respect to the magnetic anisotropic direction of the GMR film.

FIG. 17 shows the rate of change of the magnetoresistance, as it depends on the bias magnetic field, of a GMR film without anisotropy. The solid-line curves represent measured results at the time the bias magnetic field was applied in a direction which is aligned with the direction of magnetic anisotropy of the GMR film, and the broken-line curves represent measured results at the time the bias magnetic field was applied in a direction which is perpendicular to the direction of magnetic anisotropy of the GMR film. FIG. 18 shows the rate of change of the magnetoresistance, as it depends on the bias magnetic field, of a GMR film with anisotropy imparted by oblique deposition of layers. The solid-line curves represent measured results at the time the bias magnetic field was applied in a direction which is aligned with the direction of magnetic anisotropy of the GMR film, and the broken-line curves represent measured results at the time the bias magnetic field was applied in a direction which is perpendicular to the direction of magnetic anisotropy of the GMR film.

Comparison of FIGS. 17 and 18 indicate that both GMR films have the same magnetoresistance, i.e., the same rate of change of the magnetoresistance, irrespective of the direction in which the bias magnetic field is applied, and are substantially isotropic.

Figure 19:
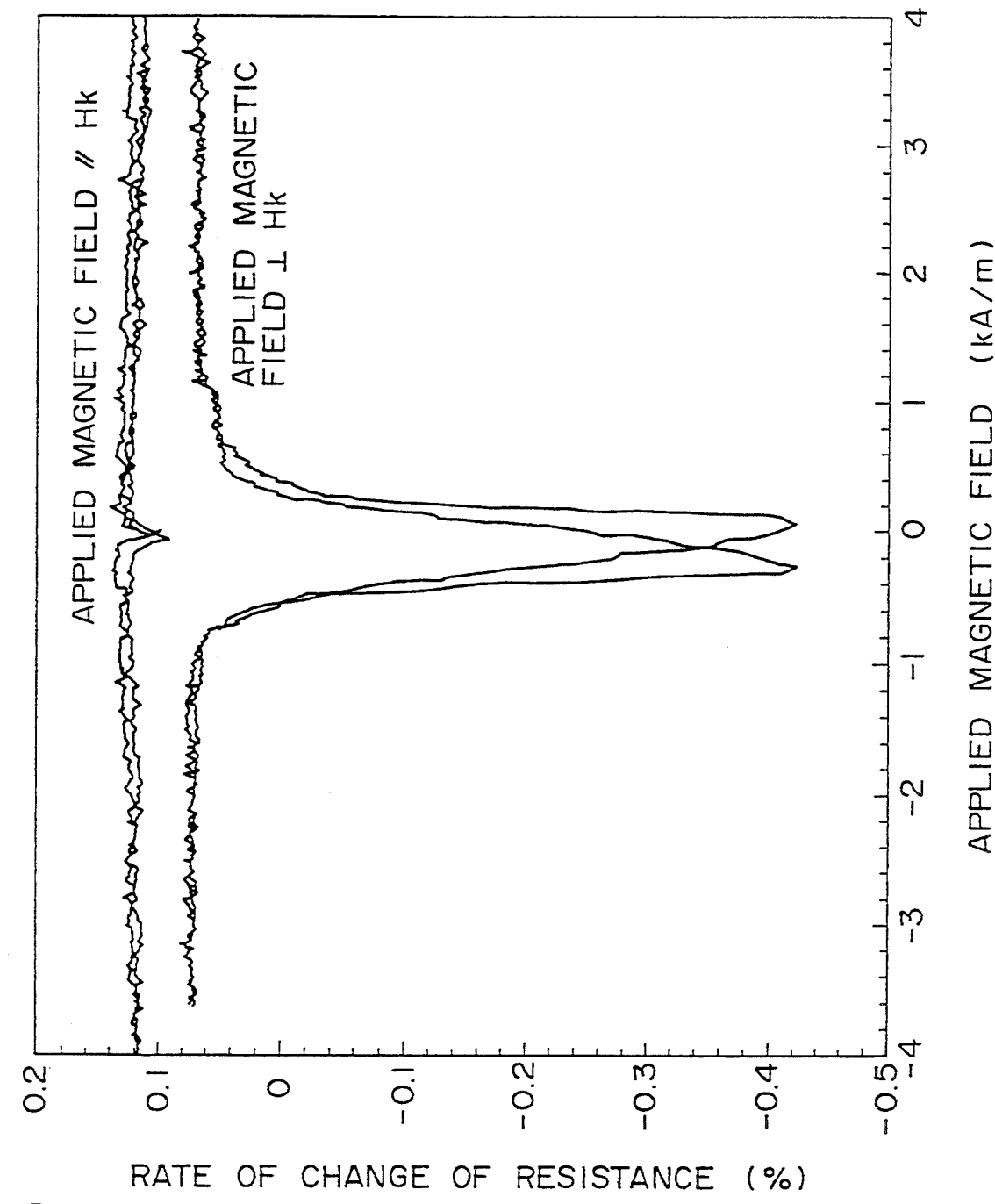
FIG. 19 is a graph showing the magnetoresistance of a Permalloy film as it depends on a bias magnetic field applied whose direction is changed with respect to the magnetic anisotropic direction of the Permalloy film.

The Permalloy film, however, exhibited widely different characteristics, as shown in FIG. 19, when the bias magnetic field was applied in directions which are aligned with and perpendicular to the direction of magnetic anisotropy of the Permalloy film.

The magnetoresistance film as described above is suitable for use as a magnetic sensor. The structures of magnetic sensors such as magnetic heads to which a vertical bias is applied and the structures of magnetic sensors to which a longitudinal bias is applied will be described below. In the case where magnetoresistance film is used as a magnetic head (MR head), a bias magnetic field may be applied in any desired direction, and the magnetic head produces a substantially equivalent effect in whichever direction the bias magnetic field is applied.

The vertical bias may be applied by using an external coil or a permanent magnet (not shown) which applies a necessary magnetic field to an MR magnetic film. With such an arrangement, the magnetic sensor can be manufactured in a small number of steps as any other patterns than an MR sensor pattern are not required on the sensor proper. However, it is difficult for the magnetic sensor to have a shield-type structure.

FIG. 20 shows a magnetic sensor structure comprising an MR magnetic film 41 and a conductive layer 42 disposed on the MR magnetic film 41. The magnetic sensor structure is simple because it is composed of two layers. However, since a sensor current flows through the conductive layer 42, the rate of change of resistance (sensitivity) is lowered.

FIG. 21 shows another magnetic sensor structure comprising MR magnetic films 41 sandwiching an insulating layer 43 therebetween. While the sensitivity of the magnetic sensor structure is now lowered, the recording density is limited because of the gap null of the insulating layer 43. The magnetic sensor structure requires three terminals.

FIG. 22 shows still another magnetic sensor structure comprising MR magnetic films 41 sandwiching a conductive layer 42 therebetween. The magnetic sensor structure is free of a short-circuit problem, but has the same problem as with the magnetic sensor structure shown in FIG. 21, and has its sensitivity lowered by a level corresponding to the current flowing through the conductive layer 42.

Figure 23:
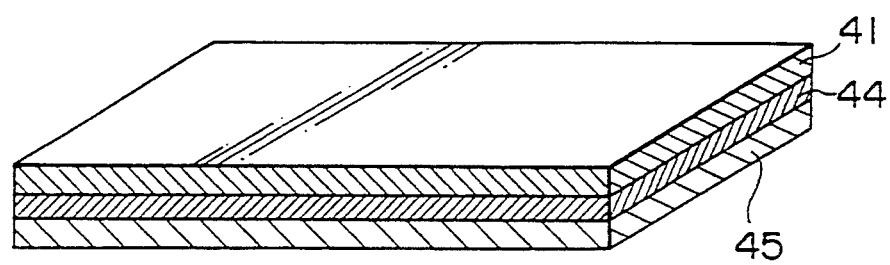
FIG. 23 is a perspective view of yet another magnetic sensor structure to which a vertical bias is applied.

FIG. 23 shows yet another magnetic sensor structure comprising an MR magnetic film 41 and a soft magnetic film 45 with a nonmagnetic (conductive or insulating) layer 44 interposed therebetween. The magnetic sensor structure suffers a short circuit across the nonmagnetic layer 44.

Figure 24:
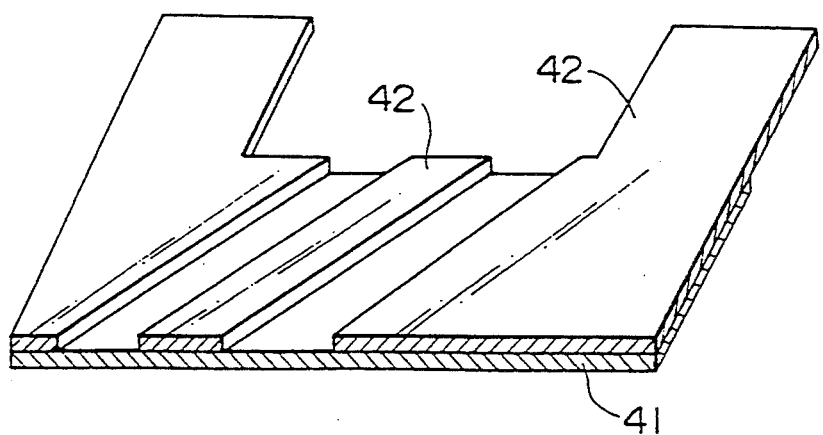
FIG. 24 is a perspective view of yet still another magnetic sensor structure to which a vertical bias is applied.

FIG. 24 shows yet still another magnetic sensor structure including an oblique conductive layer 42 superimposed on an MR magnetic film 41. Though the magnetic sensor structure is relatively simple, it is disadvantageous in that its sensitivity is low.

Magnetic sensor structures to which a longitudinal bias is applied will be described below.

Figure 25:
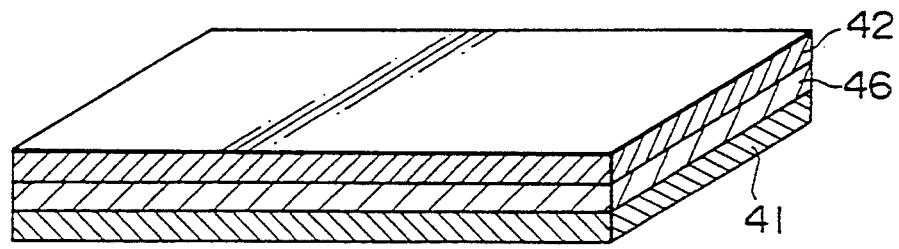
FIG. 25 is a perspective view of a magnetic sensor structure to which a longitudinal bias is applied.

FIG. 25 shows a magnetic sensor structure comprising an MR magnetic film 41 and a conductive layer 42 with an anti-ferromagnetic film 46 sandwiched therebetween. The magnetic sensor structure is relatively simple, but its sensitivity is low.

Figure 26:
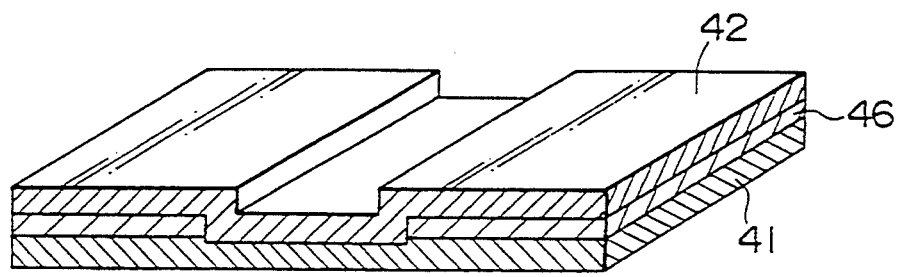
FIG. 26 is a perspective view of another magnetic sensor structure to which a longitudinal bias is applied.

FIG. 26 shows another magnetic sensor structure comprising an MR magnetic film 41 and a conductive layer 42 with an anti-ferromagnetic film 46 sandwiched therebetween except for a track width. The magnetic sensor structure suffers a low sensitivity drop, but is fabricated in a number of steps including an extra step, and is less advantageous.

Figure 27:
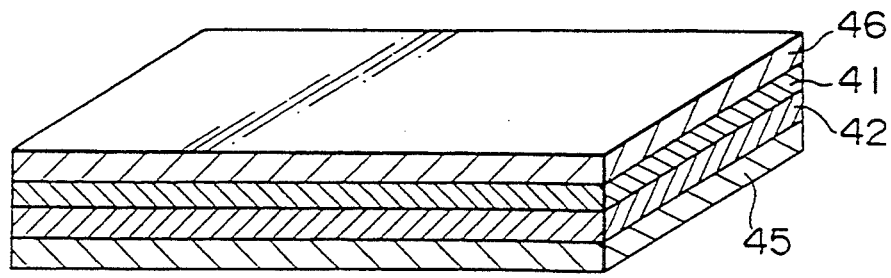
FIG. 27 is a perspective view of still another magnetic sensor structure to which a longitudinal bias is applied.

FIG. 27 shows still another magnetic sensor structure which is a combination of the magnetic sensor structure shown in FIG. 23 and the magnetic sensor structure shown in FIG. 26. The advantages of the magnetic sensor structure shown in FIG. 27 are also a combination of those of the magnetic sensor structures shown in FIGS. 23 and 26.

Figure 28:
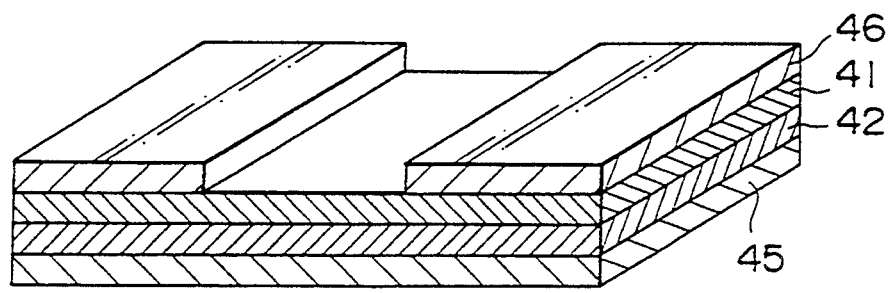
FIG. 28 is a perspective view of yet another magnetic sensor structure to which a longitudinal bias is applied.

FIG. 28 shows yet another magnetic sensor structure which is a combination of the magnetic sensor structure shown in FIG. 23 and the magnetic sensor structure shown in FIG. 27. The advantages of the magnetic sensor structure shown in FIG. 28 are also a combination of those of the magnetic sensor structures shown in FIGS. 23 and 27.

Figure 29:
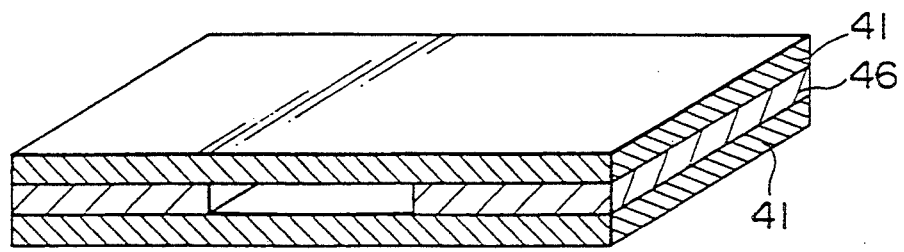
FIG. 29 is a perspective view of yet still another magnetic sensor structure to which a longitudinal bias is applied.

FIG. 29 shows yet still another magnetic sensor structure which is a combination of the magnetic sensor structure shown in FIG. 21 or 22 and the magnetic sensor structure shown in FIG. 27. The advantages of the magnetic sensor structure shown in FIG. 29 are also a combination of those of the magnetic sensor structures shown in FIGS. 21 or 22 and 27.

An alternative arrangement may include a thin film of permanent magnet arranged to produce a magnetic field in the direction of a track width. While this arrangement can be manufactured in a small number of steps, it is difficult to employ a shield-type structure for the arrangement.

The above examples of the present invention may be modified based on the technical principles of the present invention.

For example, the number of combinations of conductive and magnetic layers, and the materials of conductive and magnetic layers may be modified. The magnetic layers may be made of Fe, Ni, or their mixture, rather than Co, and the conductive layers may be made of Ag, Cr, Ru, or their mixture, rather than Cu.

In Example 2, the magnetic element added to the conductive layers may be Fe, Ni, or their mixture, rather than Co.

In each of the above examples, the RF magnetron sputtering process is employed. However, any of various other sputtering processes may be relied upon. The layers may be formed by an evaporation process insofar as the travel of particles and the angle at which they are deposited can be controlled.

As described above, in the magnetoresistance device employing the magnetoresistance film of artificial lattice film structure, the anisotropic magnetic field $H_k$ of the magnetic layers 2, and the anti-ferromagnetic coupling magnetic field $H_s$ between the magnetic layers 2 that face each other through the conductive layers 2 satisfy the relationship $H_k < H_s$. Therefore, reductions in the large magnetoresistance due to the anisotropy of the magnetic layers are prevented from occurring.

In the magnetoresistance film of artificial lattice film structure or the magnetoresistance device employing such magnetoresistance film, the conductive layers contain 0.05 to 5 atomic % of at least one material selected from the group consisting of iron, cobalt, and nickel. Therefore, a large change in resistance can be obtained, i.e., a high sensitivity can be obtained, in response to a small change in the magnetic field.

When the artificial lattice film structure is formed, the incident angle at which particles to be deposited are applied to a substrate so as to be physically deposited thereon is selected to be 30 degrees or less with respect to the line normal to the substrate, the temperature of the substrate is kept at 100° C. or lower, and conductive layers are formed by a physical deposition process which employs a source of particles to be deposited which are made of 0.1 to 10 atomic % of at least one material selected from the group consisting of iron, cobalt, and nickel. The artificial lattice film structure thus formed exhibits good stable magnetoresistance.

Since the range of $1.02 \times d_{max} \leq d \leq 1.10 \times d_{max}$ or $0.90 \times d_{max} \leq d \leq 0.98 \times d_{max}$ is satisfied in the magnetoresistance film of artificial lattice film structure, the magnetoresistance device is of high sensitivity.

The magnetoresistance film of artificial lattice film structure has its magnetic layers made of a magnetic material composed primarily of $CO_xNi_{1-x}$ ($0.05 \leq X \leq 0.9$). Thus, the magnetoresistance device is of high sensitivity. Furthermore, the resistance of the magnetoresistance device is rendered high by providing the conductive and magnetic layers in three or more periodic combinations and ten or less periodic combinations.

Inasmuch as the magnetoresistance of the magnetoresistance film of artificial lattice film structure is exhibited substantially isotropically in the plane of the layers, the direction in which a magnetic field is applied may be selected as desired. As it is not necessary to control the direction of anisotropy upon film growth, the magnetoresistance film has advantages with respect to the productivity.

Although certain preferred embodiments of the present invention have been shown and described in detail, it should be understood that various changes and modifications may be made therein without departing from the scope of the appended claims.

What is claimed is:

1. A magnetoresistance film, comprising:
an artificial lattice film structure comprising alternating conductive and magnetic layers, wherein the thickness d of each conductive layer is selected in the range of:

$$1.02 \times d_{max} \leq d \leq 1.10 \times d_{max}$$

or $$0.90 \times d_{max} \leq d \leq 0.98 \times d_{max}$$

where $d_{max}$ is the thickness of each conductive layer at the time the magnetoresistance is of its maximum value, and said conductive layers containing 0.05 to 5 atomic percent of at least one material selected from the group consisting of iron, cobalt, and nickel, the magnetoresistance being substantially isotropically in a plane of the layer.

2. A magnetoresistance film according to claim 1, wherein each of the magnetic layers be made of a magnetic material composed primarily of $CO_xNi_{1-x}$ ($0.05 \leq x \leq 0.9$).

3. A magnetoresistance film according to claim 1, wherein said conductive and magnetic layers are provided in three or more periodic combinations and ten or less periodic combinations.

* * * * *